(12) United States Patent
Meyer-Berg et al.

(10) Patent No.: US 8,124,449 B2
(45) Date of Patent: Feb. 28, 2012

(54) DEVICE INCLUDING A SEMICONDUCTOR CHIP AND METAL FOILS

(75) Inventors: Georg Meyer-Berg, Munich (DE); Andreas Schloegl, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 538 days.

(21) Appl. No.: 12/326,529

(22) Filed: Dec. 2, 2008

(65) Prior Publication Data

US 2010/0133666 A1    Jun. 3, 2010

(51) Int. Cl.
H01L 23/495    (2006.01)
H01L 21/60    (2006.01)
(52) U.S. Cl. ........ 438/107; 257/341; 257/578; 257/584; 257/587; 257/735; 257/736; 257/773; 257/E23.01; 257/E23.012; 257/E23.013; 257/E23.078; 257/E23.079; 257/E21.506
(58) Field of Classification Search ................. 257/341, 257/578, 584, 587, 735, 736, 773, E23.01, 257/E23.012, E23.013, E23.078, E23.079, 257/E21.506; 438/107
See application file for complete search history.

(56) References Cited

U.S. PATENT DOCUMENTS

| | | | | |
|---|---|---|---|---|
| 4,538,170 | A * | 8/1985 | Yerman | 257/705 |
| 6,307,755 | B1 * | 10/2001 | Williams et al. | 361/813 |
| 6,448,645 | B1 * | 9/2002 | Kimura et al. | 257/735 |
| 2005/0218498 | A1 * | 10/2005 | Hata et al. | 257/690 |
| 2006/0145319 | A1 * | 7/2006 | Sun et al. | 257/678 |
| 2006/0197200 | A1 * | 9/2006 | Kajiwara et al. | 257/673 |
| 2007/0013209 | A1 | 1/2007 | Neuburger et al. | |
| 2007/0040254 | A1 * | 2/2007 | Lopez | 257/678 |
| 2007/0132073 | A1 | 6/2007 | Tiong et al. | |
| 2008/0207814 | A1 * | 8/2008 | Wrosch et al. | 524/440 |
| 2009/0133251 | A1 | 5/2009 | Tuominen et al. | |

FOREIGN PATENT DOCUMENTS

| | | |
|---|---|---|
| EP | 1617714 B1 | 9/2008 |
| WO | 03065778 A1 | 8/2003 |
| WO | 03065779 A1 | 8/2003 |
| WO | 2004077902 A1 | 9/2004 |
| WO | 2004077903 A1 | 9/2004 |
| WO | 2004089048 A1 | 10/2004 |
| WO | 2005020651 A1 | 3/2005 |
| WO | 2005027602 A1 | 3/2005 |
| WO | 2005104635 A1 | 11/2005 |
| WO | 2005104636 A1 | 11/2005 |
| WO | 2005125298 A1 | 12/2005 |
| WO | 2006013230 A1 | 2/2006 |
| WO | 2006056643 A1 | 6/2006 |
| WO | 2006056648 A1 | 6/2006 |
| WO | 2006134216 A1 | 12/2006 |
| WO | 2006134217 A1 | 12/2006 |
| WO | 2006134220 A1 | 12/2006 |

* cited by examiner

*Primary Examiner* — Eugene Lee
*Assistant Examiner* — Peniel M Gumedzoe
(74) *Attorney, Agent, or Firm* — Dicke, Billig & Czaja, PLLC

(57) ABSTRACT

A device including a semiconductor chip and metal foils. One embodiment provides a device including a semiconductor chip having a first electrode on a first face and a second electrode on a second face opposite to the first face. A first metal foil is attached to the first electrode of the semiconductor chip in an electrically conductive manner. A second metal foil is attached to the second electrode of the semiconductor chip in an electrically conductive manner.

23 Claims, 44 Drawing Sheets

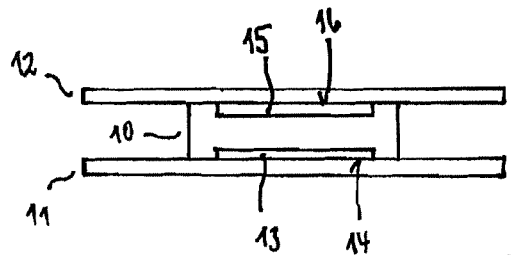
Fig. 1
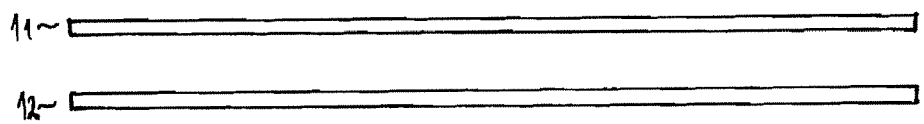
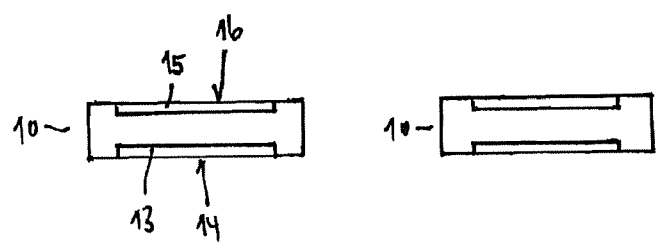
Fig. 2A
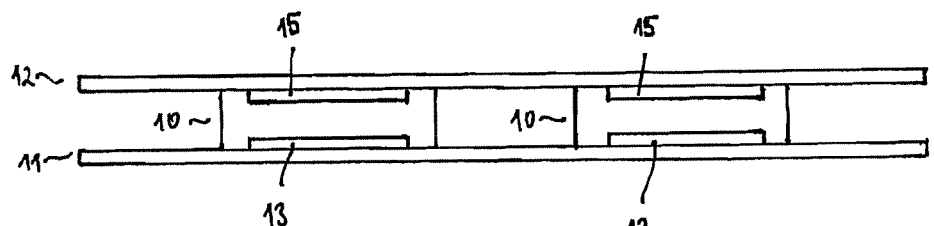
Fig. 2B

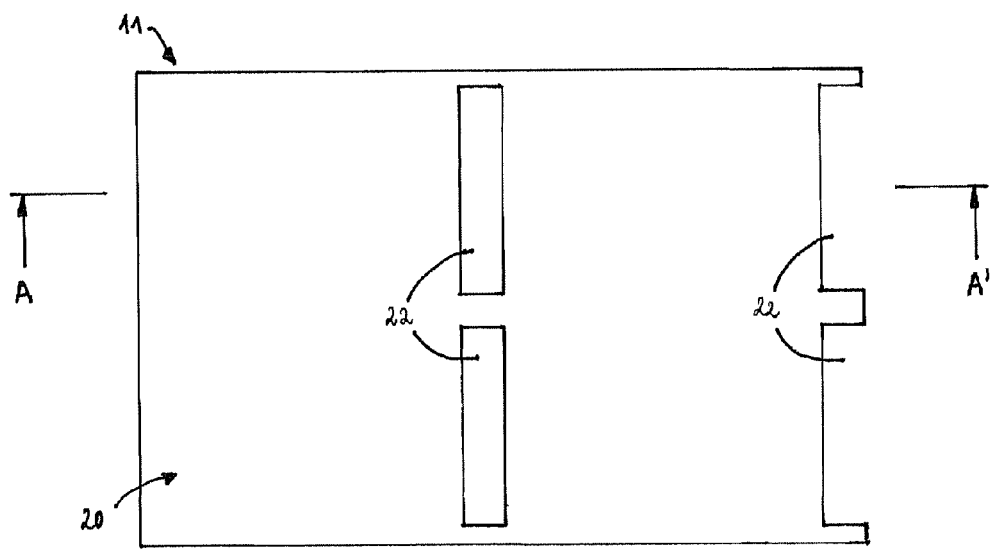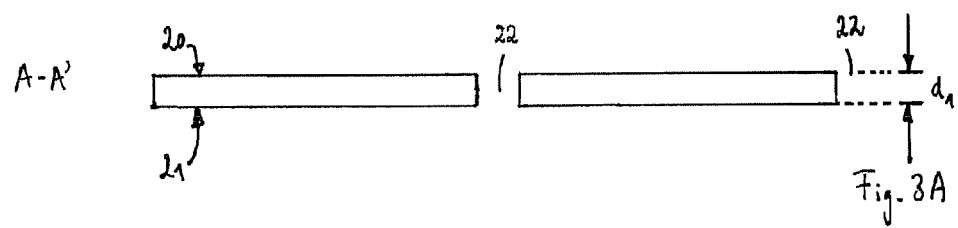
Fig. 3A

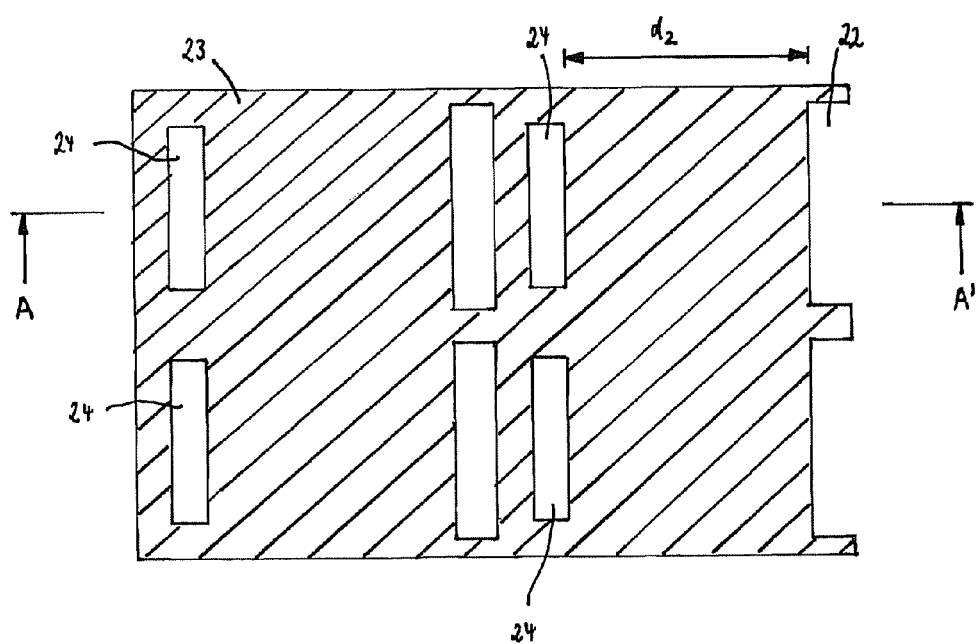
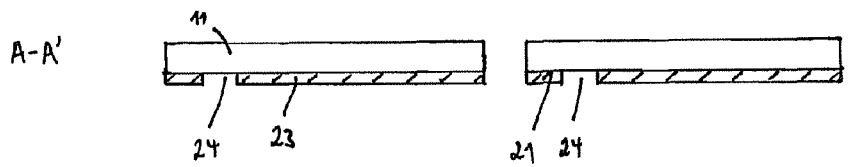
Fig. 3B

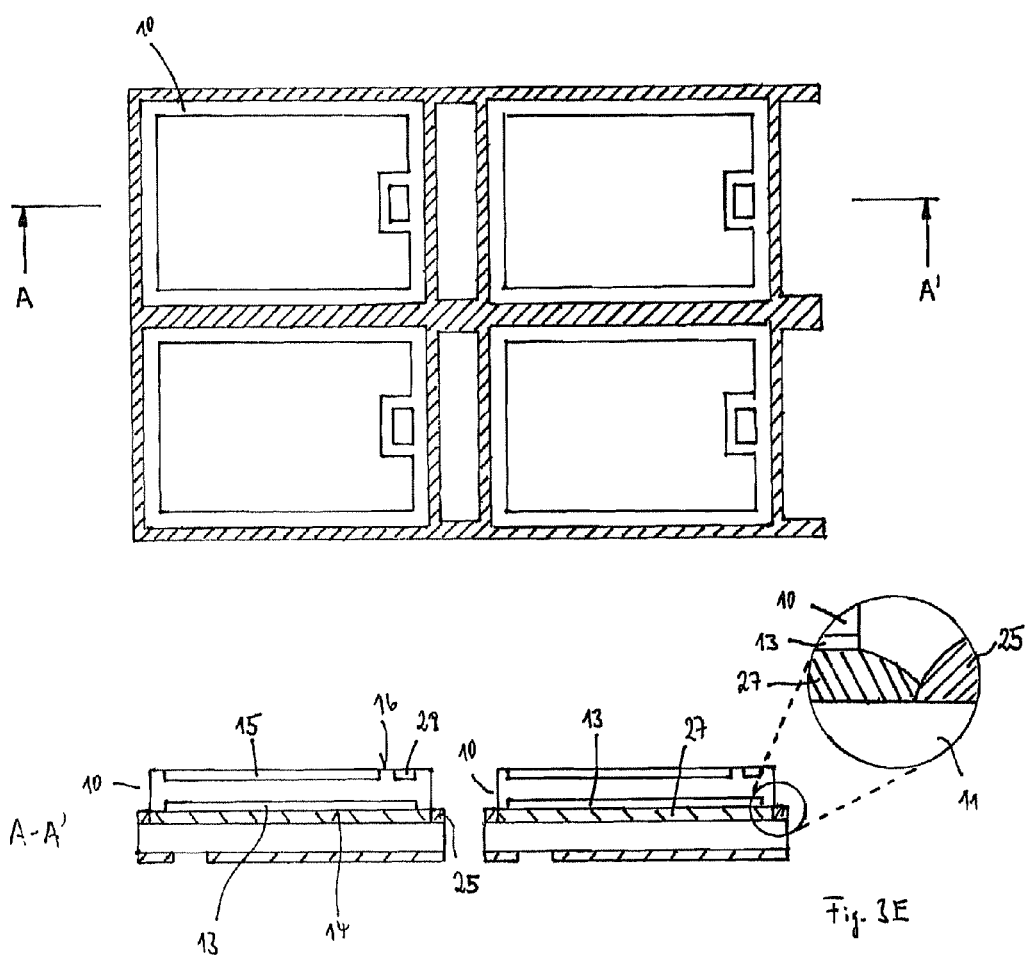

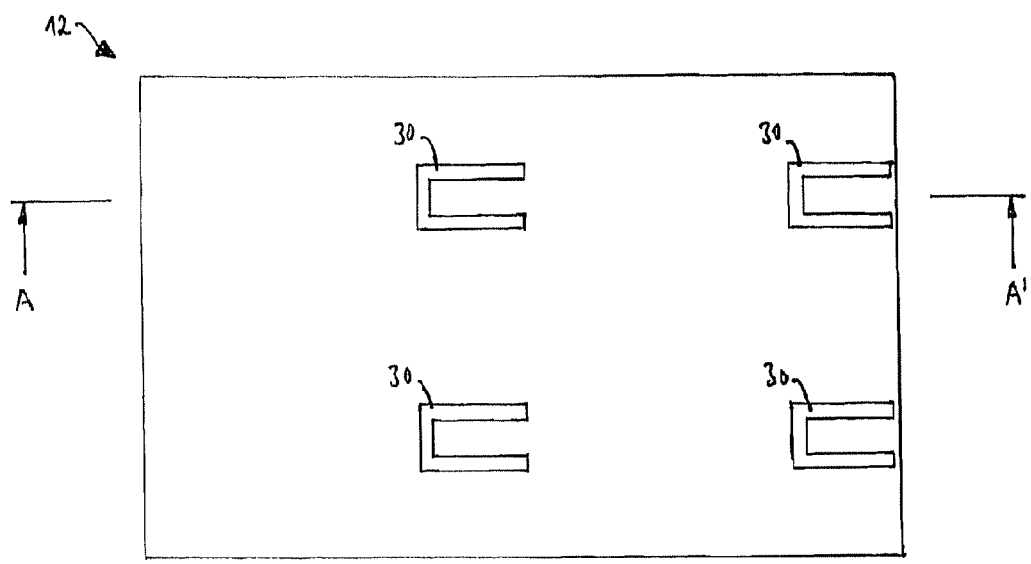
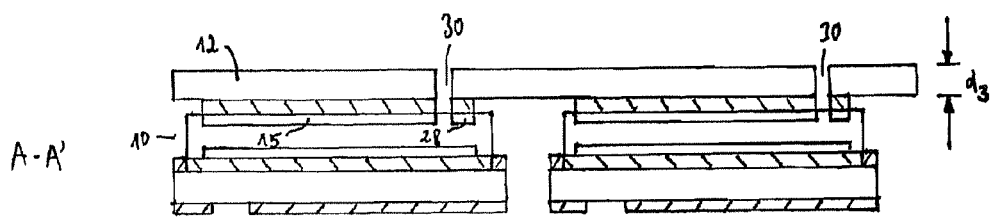
Fig. 36

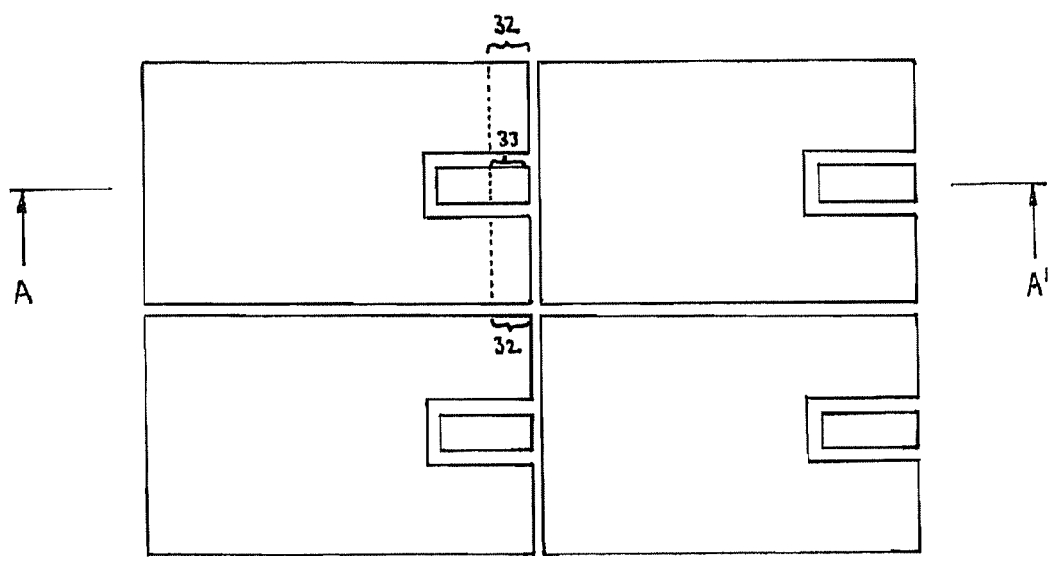
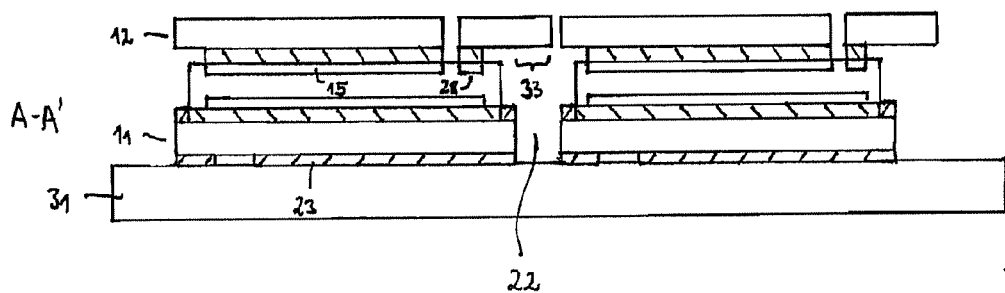
Fig. 3H

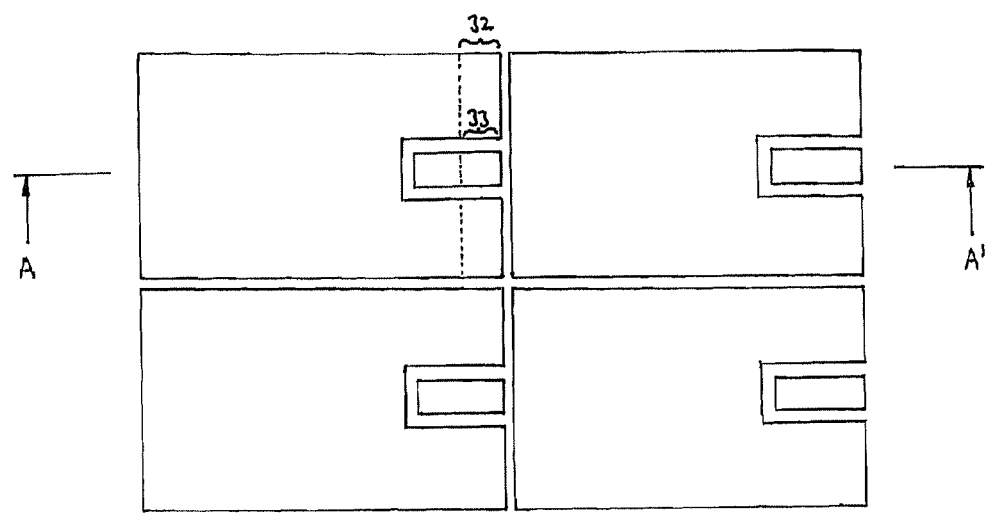
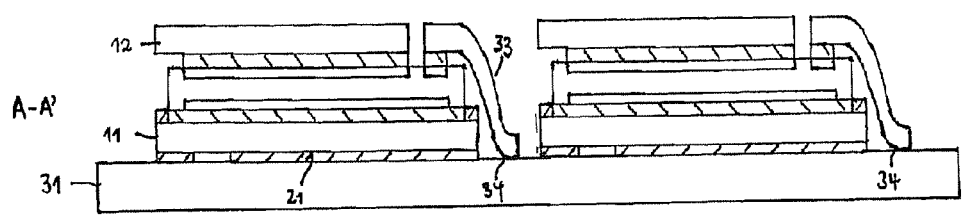
Fig. 3I

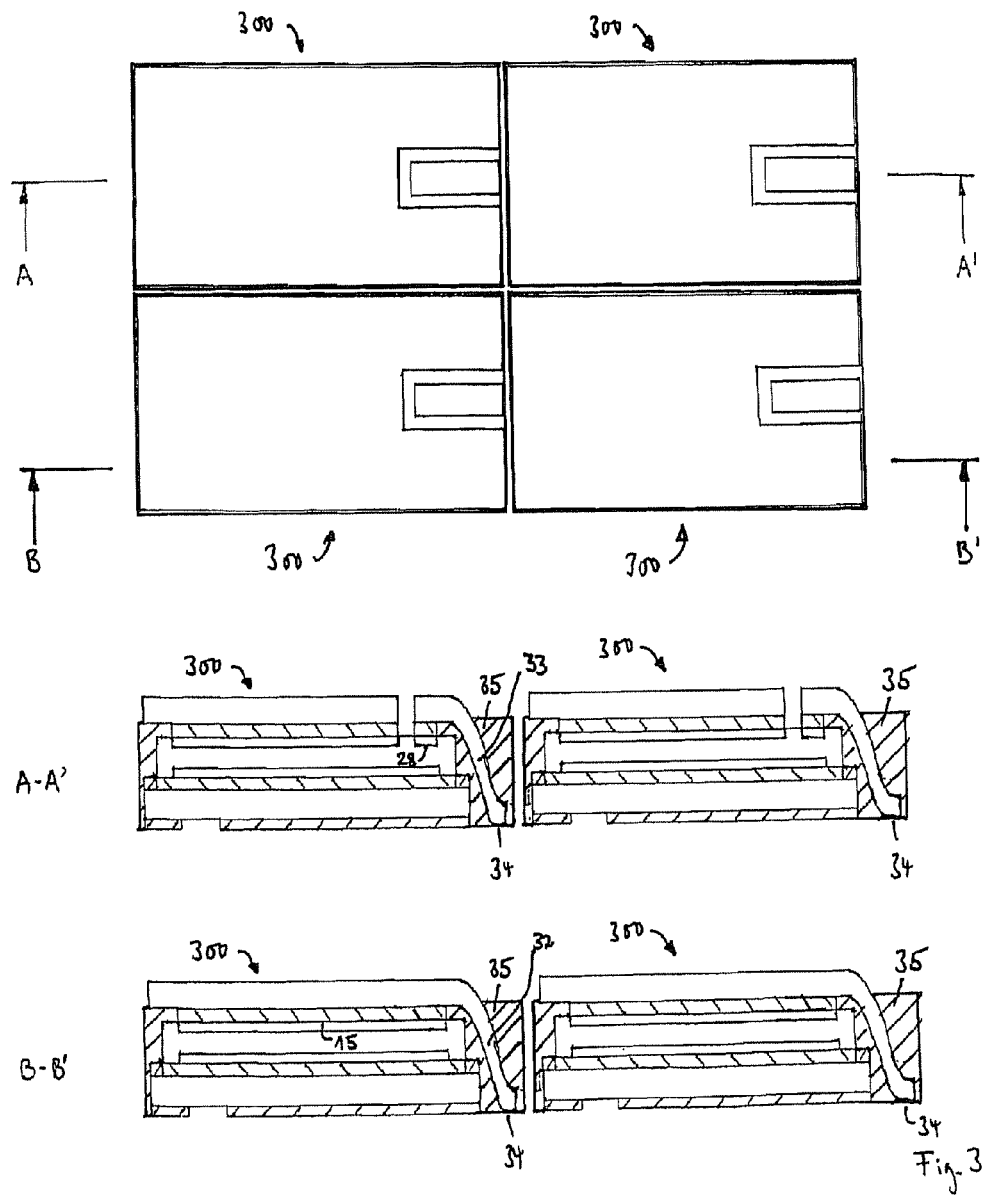

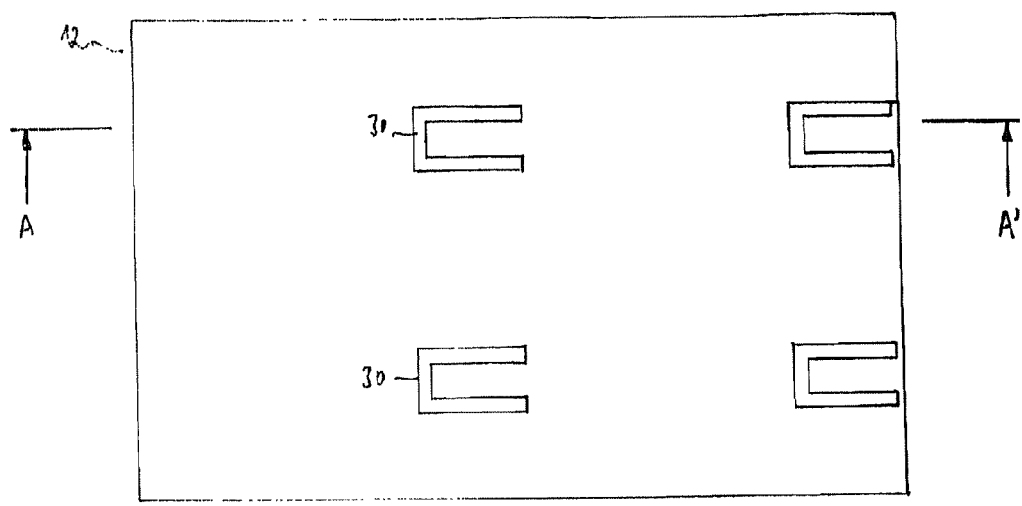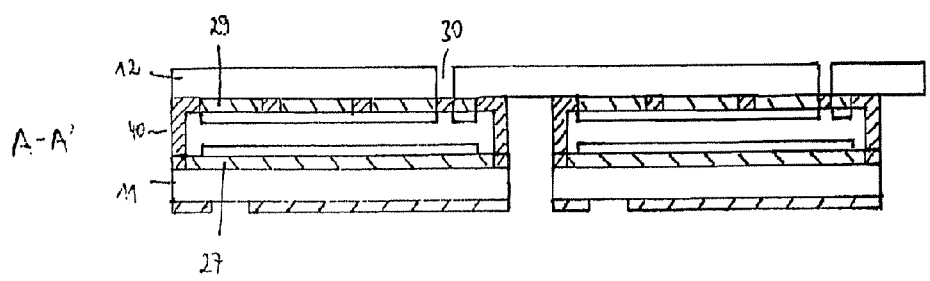
Fig. 4D

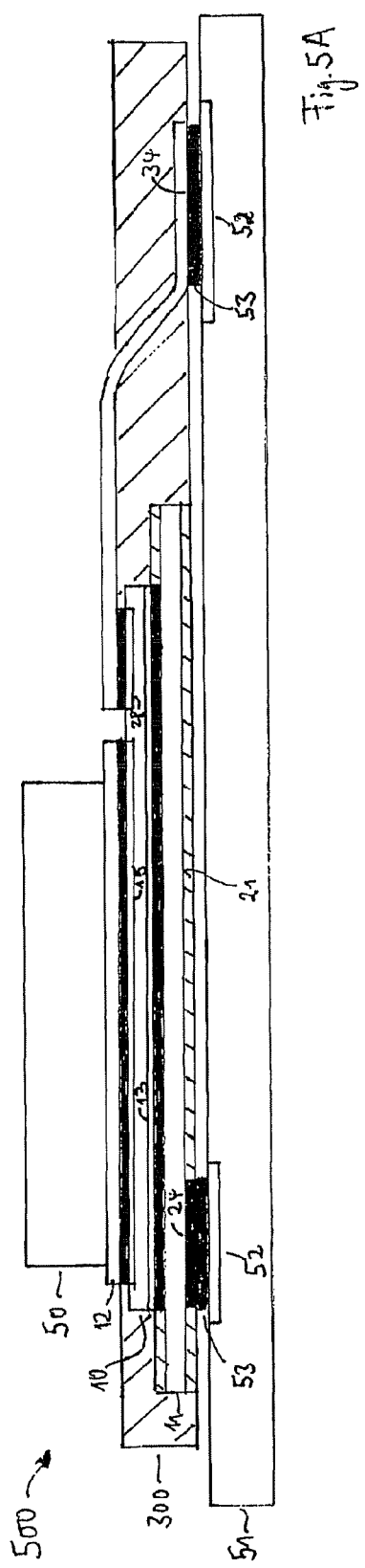
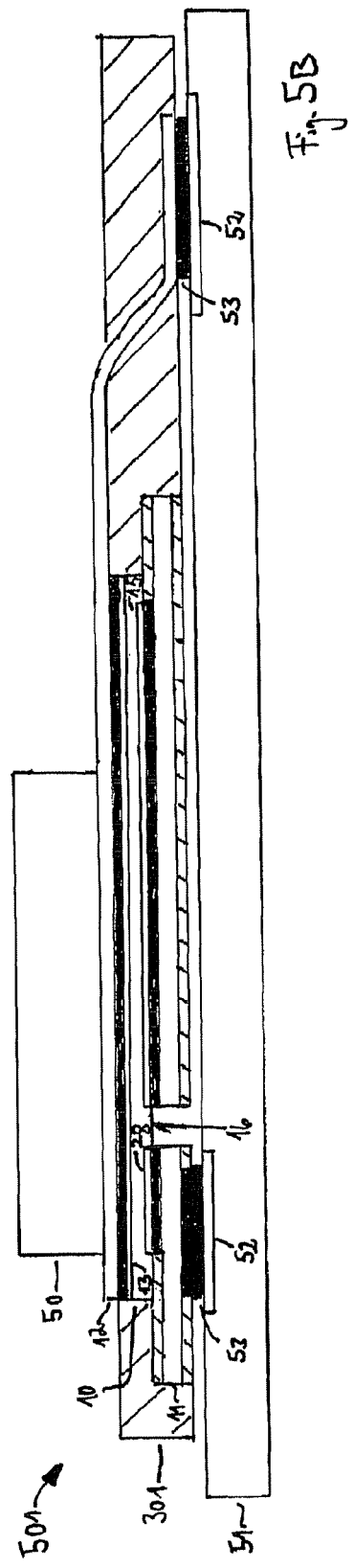
Fig. 5A
Fig. 5B

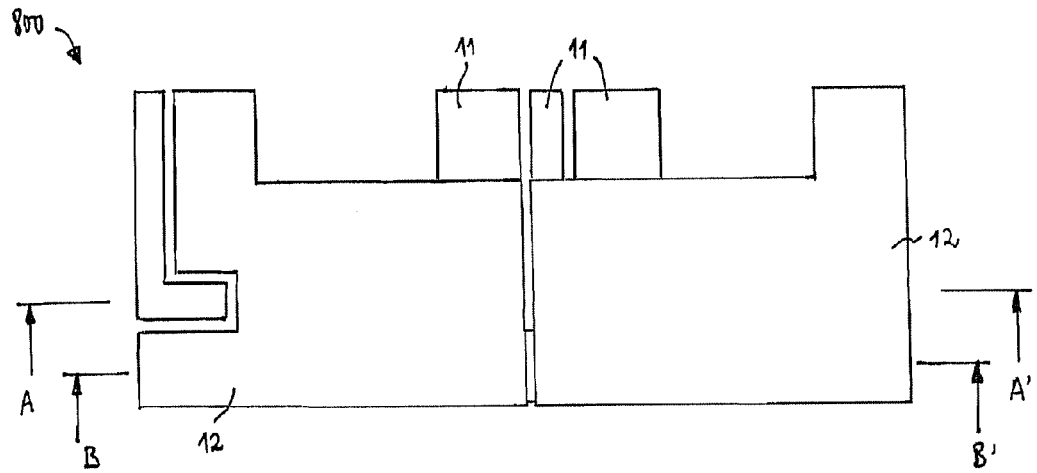
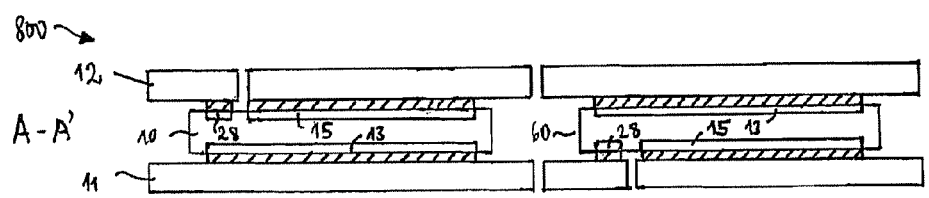
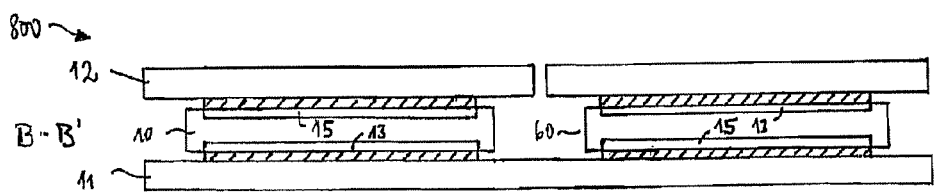
Fig. 8
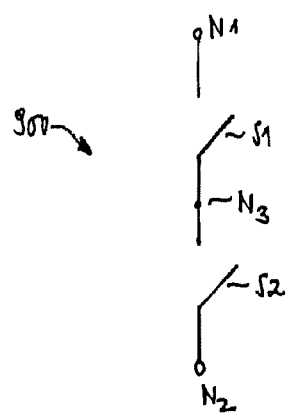
Fig. 9

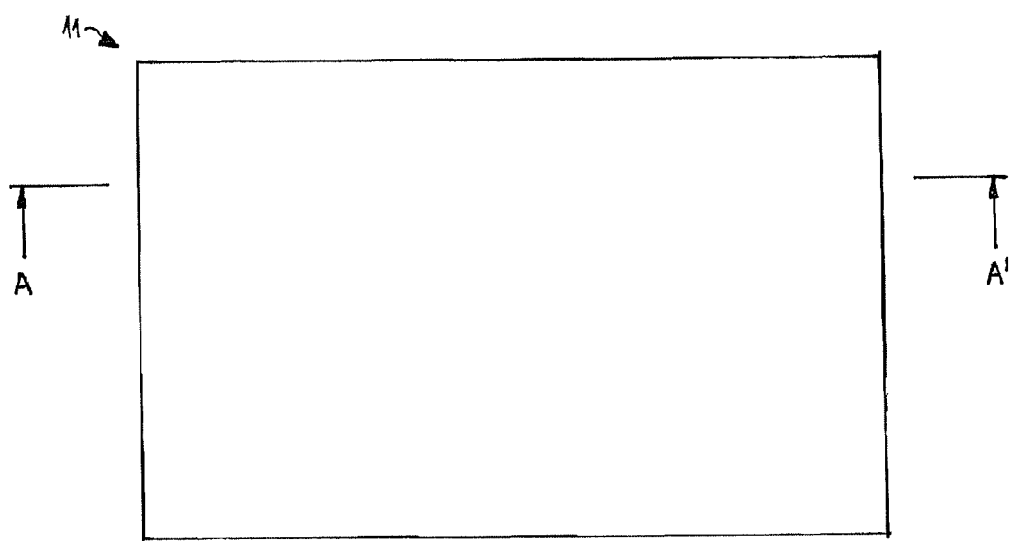
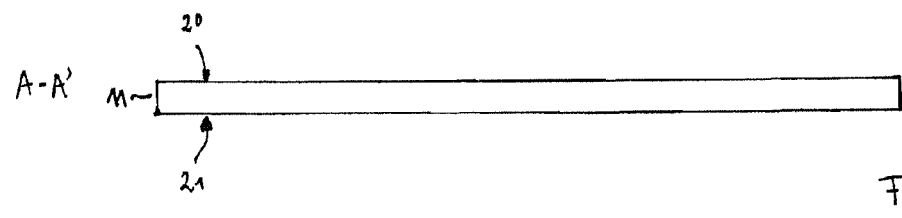
Fig. 10A

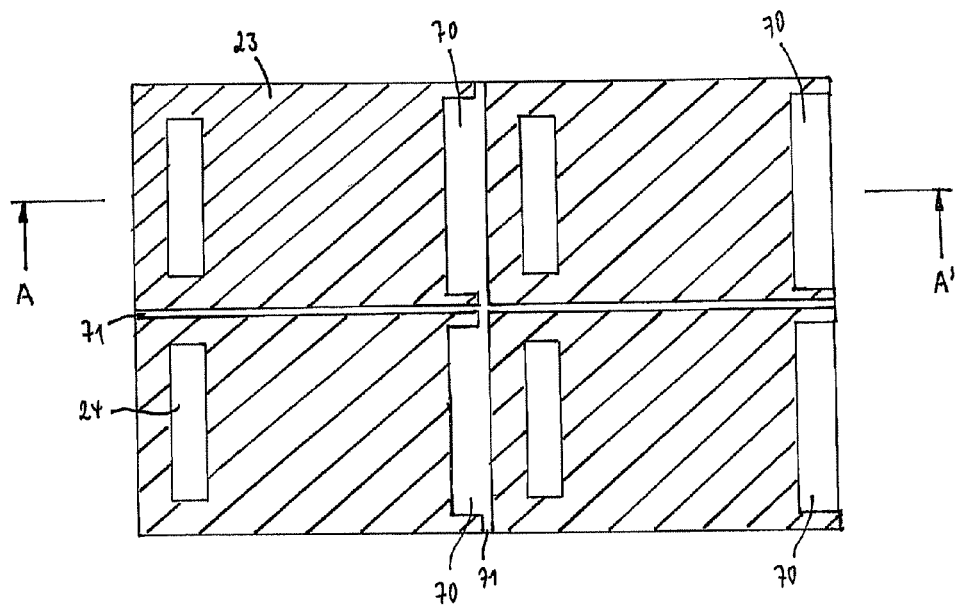
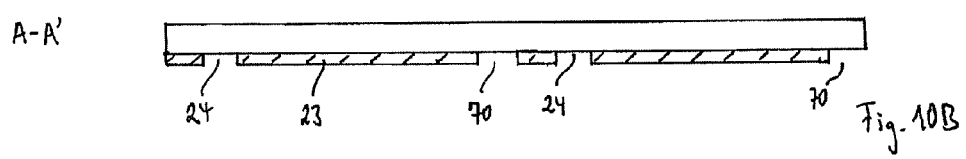
Fig. 10B

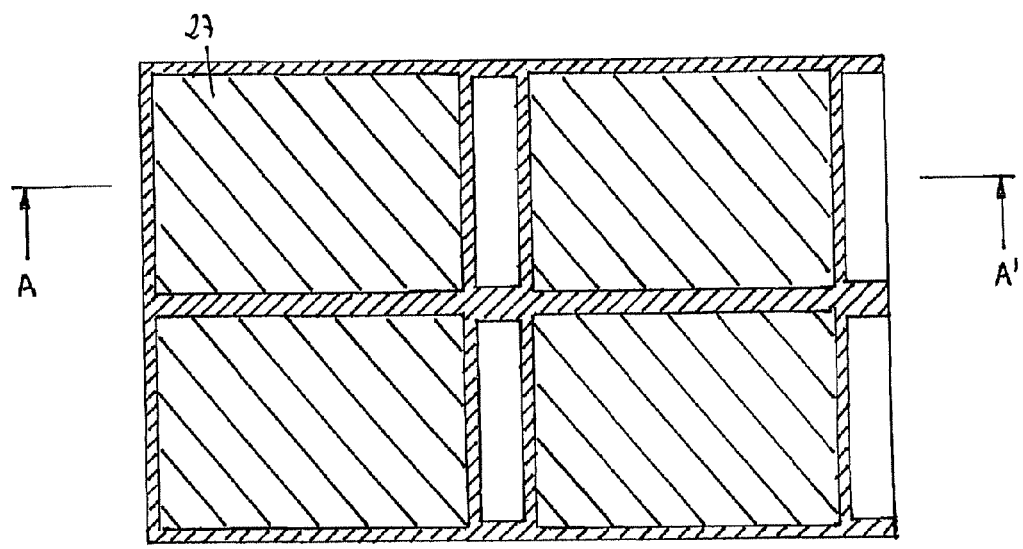
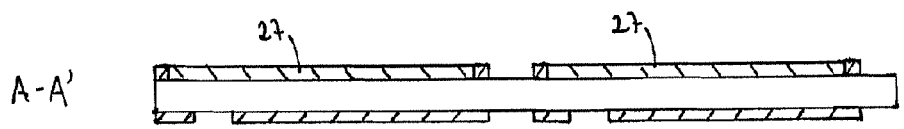
Fig. 10D

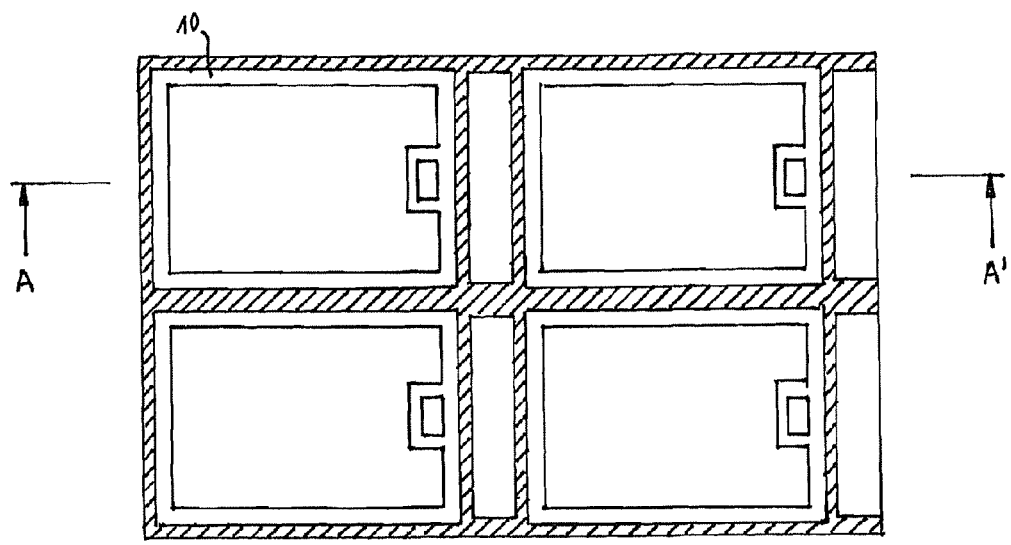
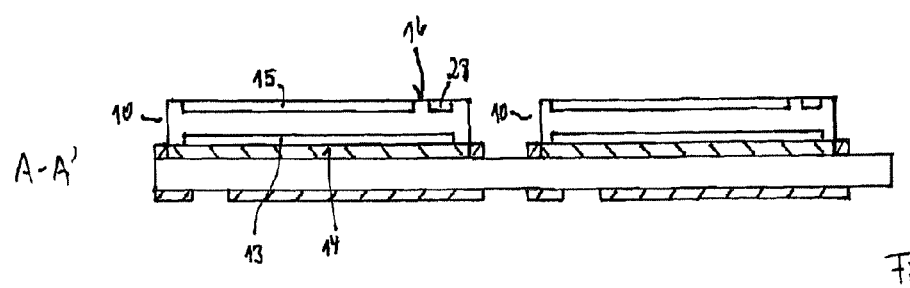
Fig. 10E

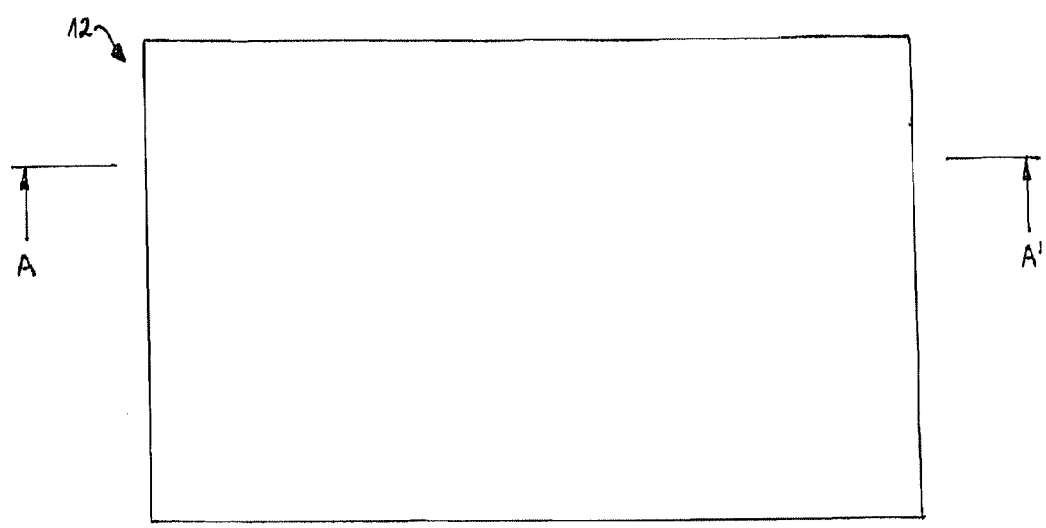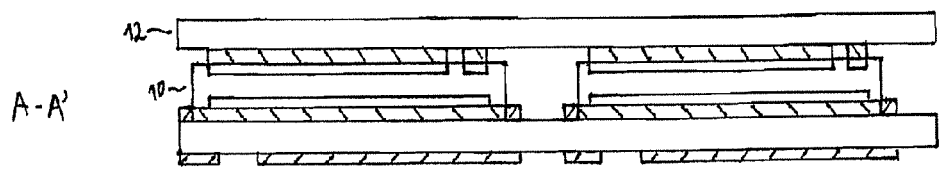
Fig. 10G

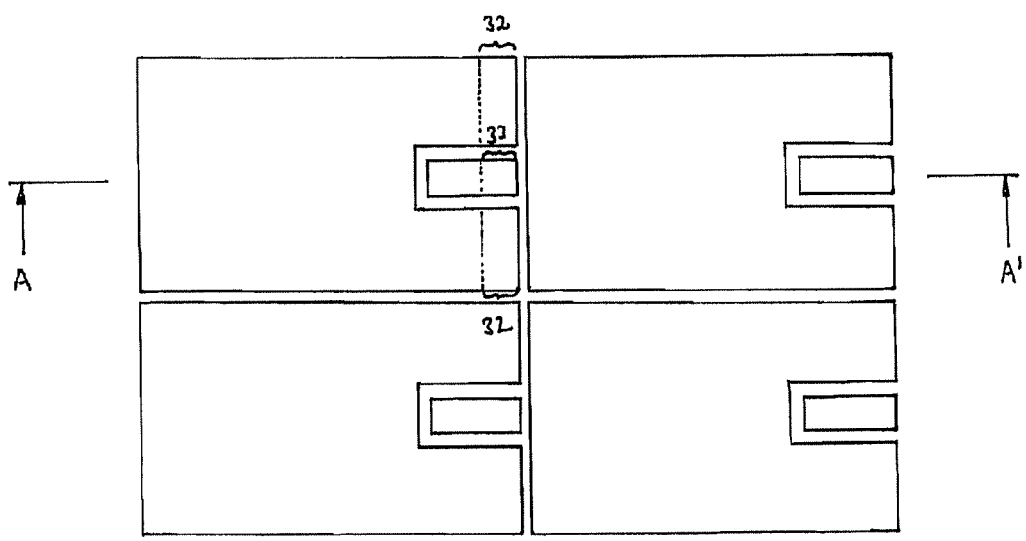
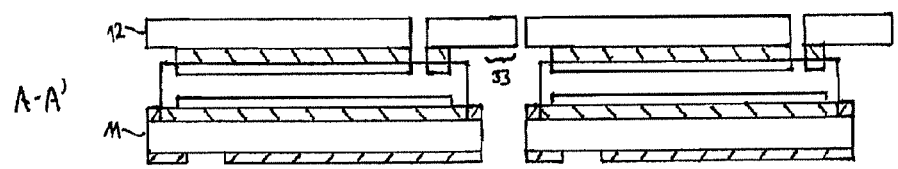
Fig. 10 I

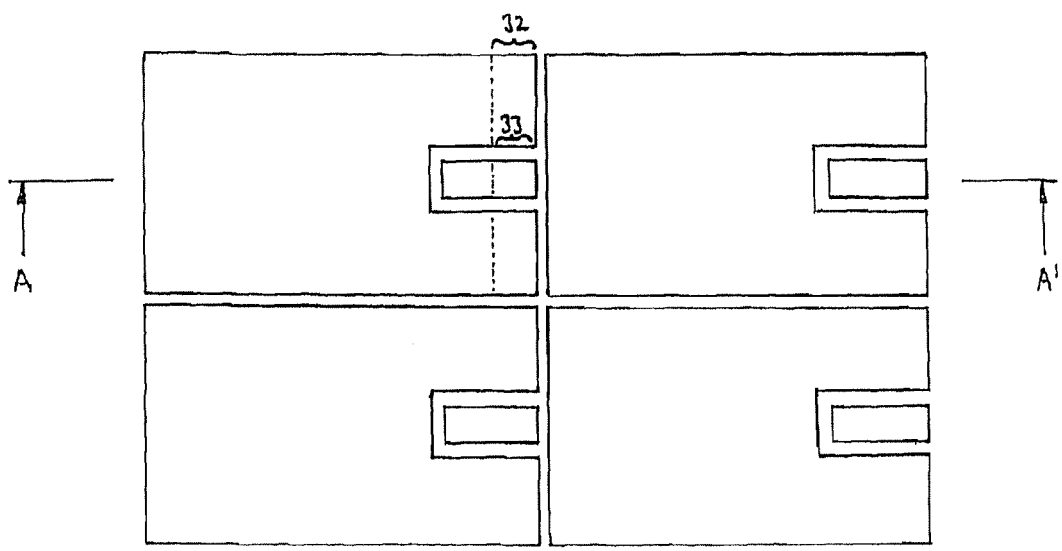
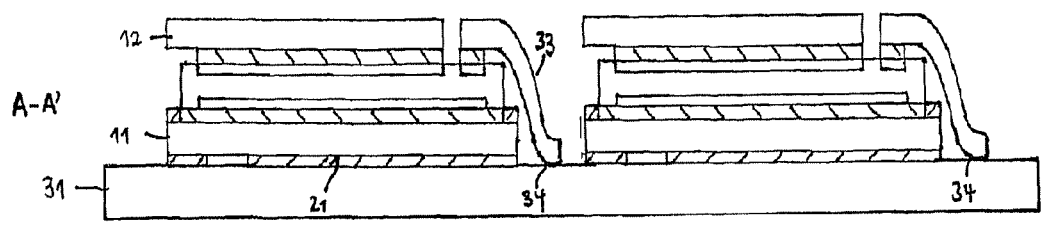
Fig. 10j

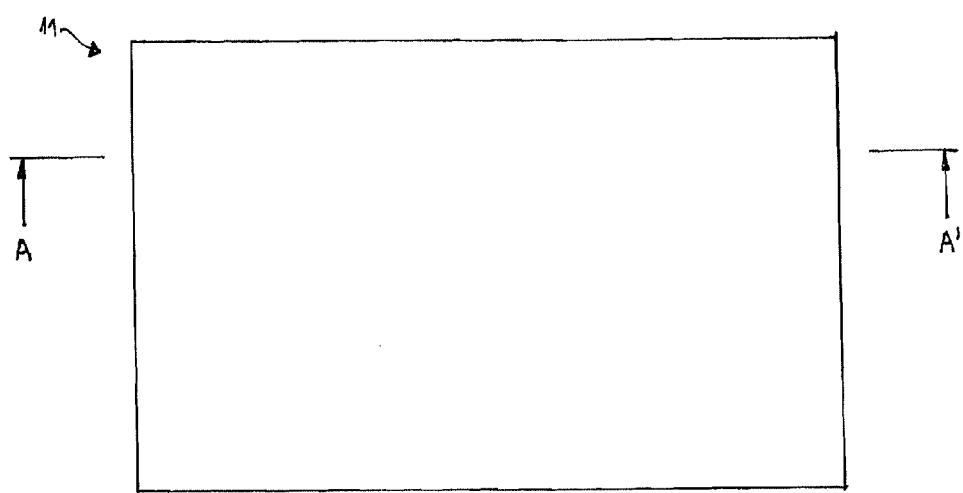
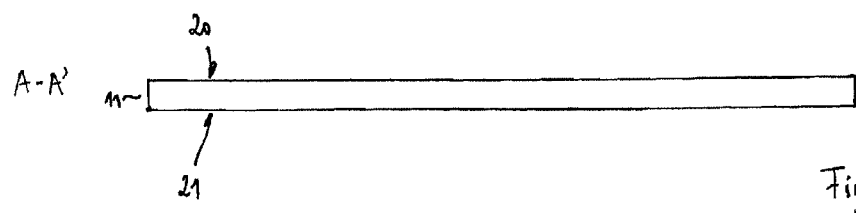
Fig. 11A

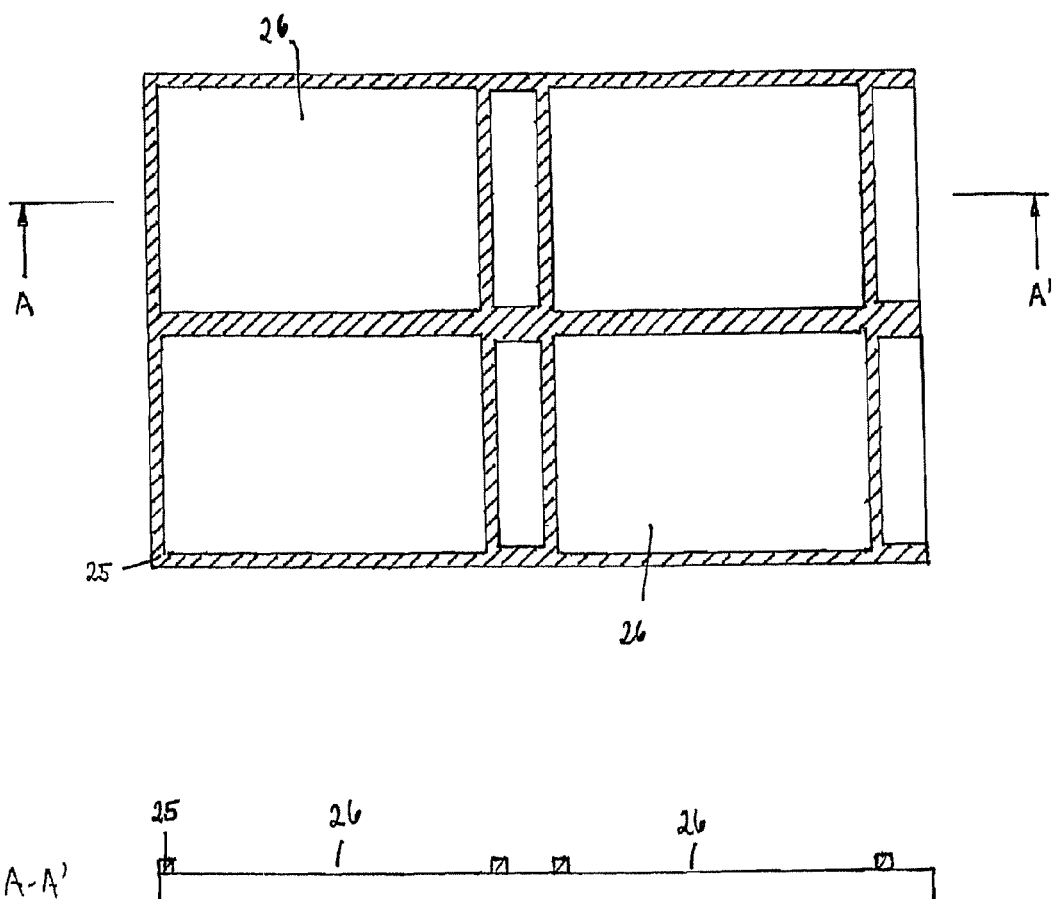

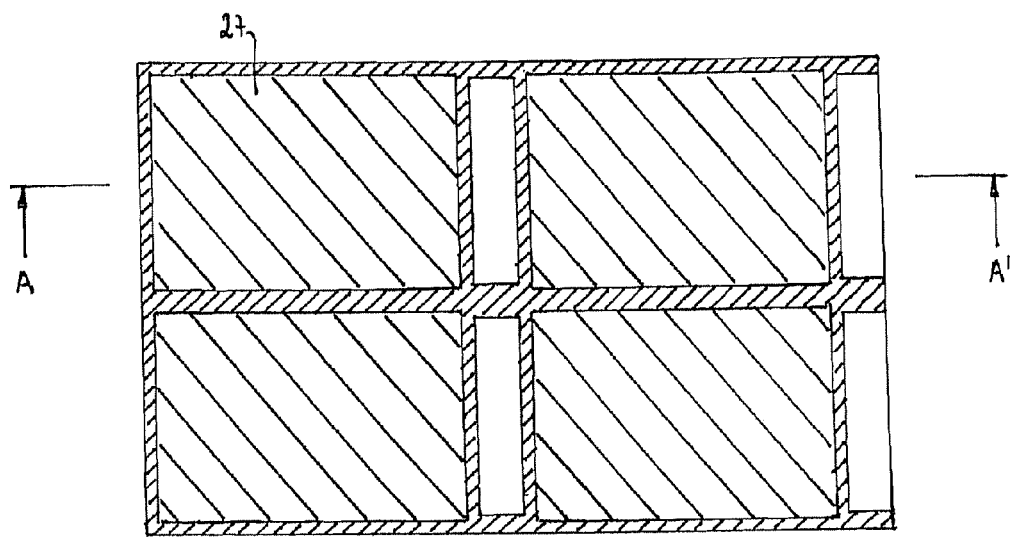
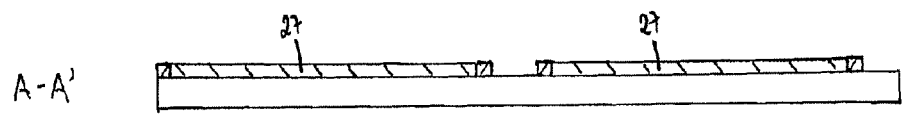
Fig. 11C

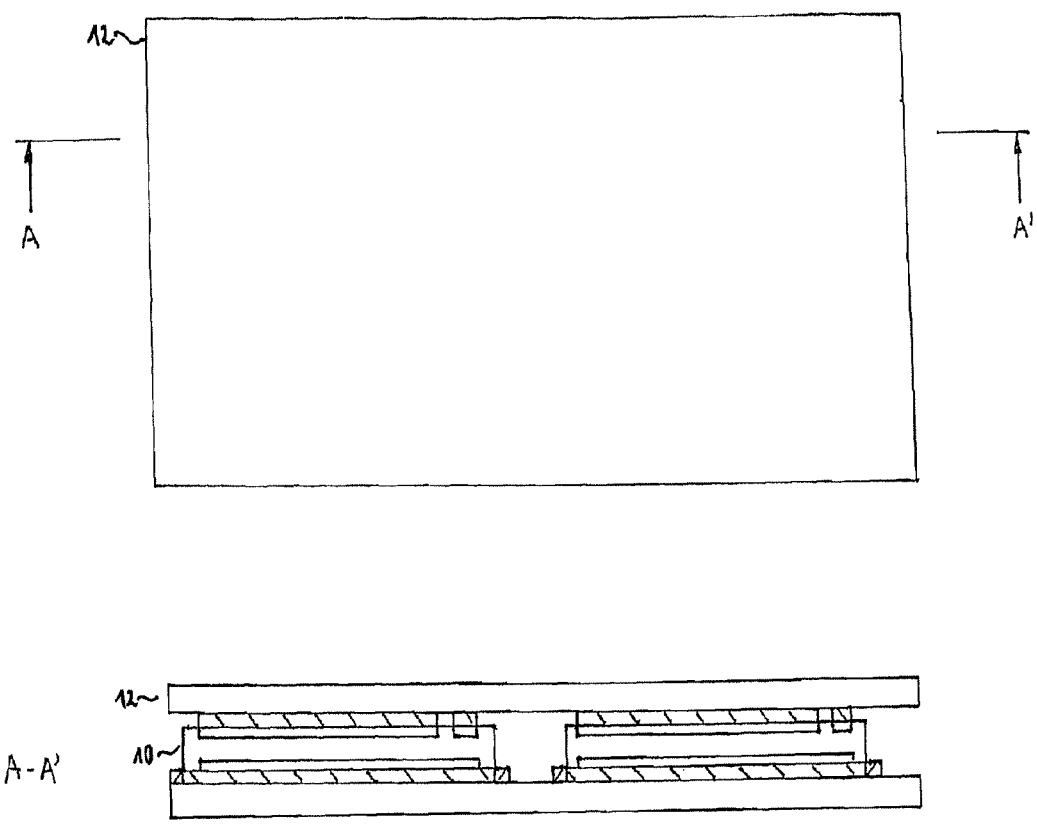

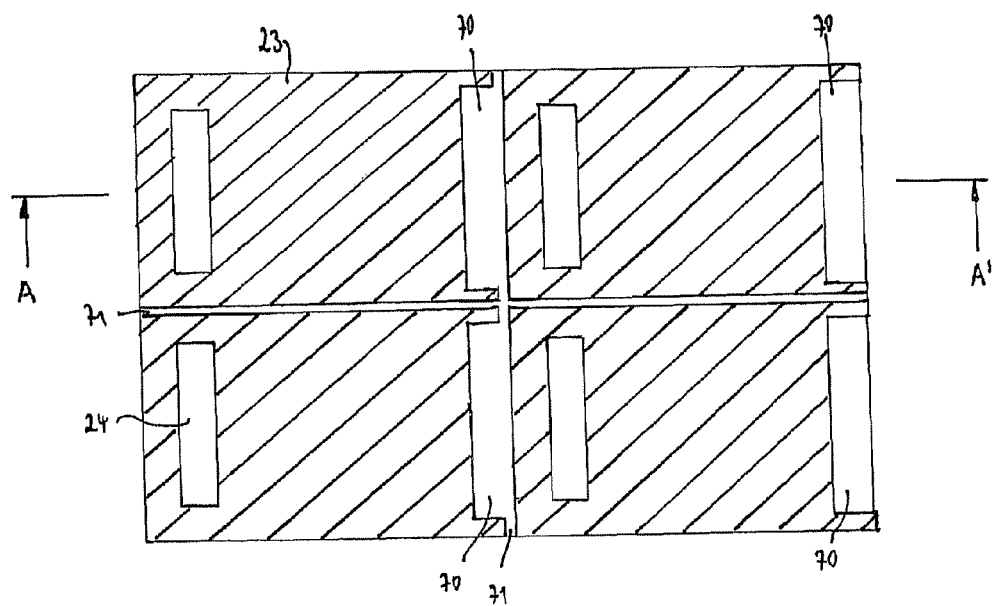
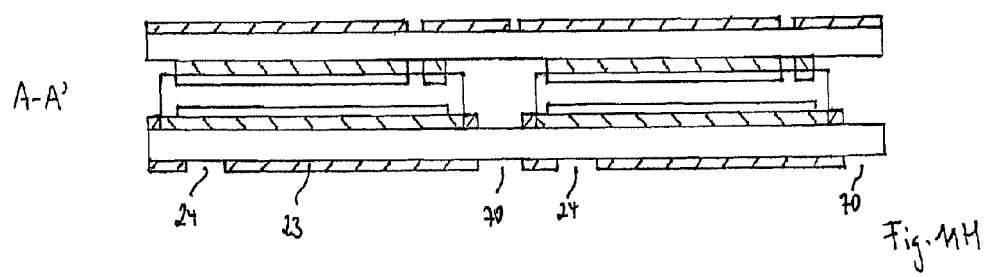
Fig. 11H

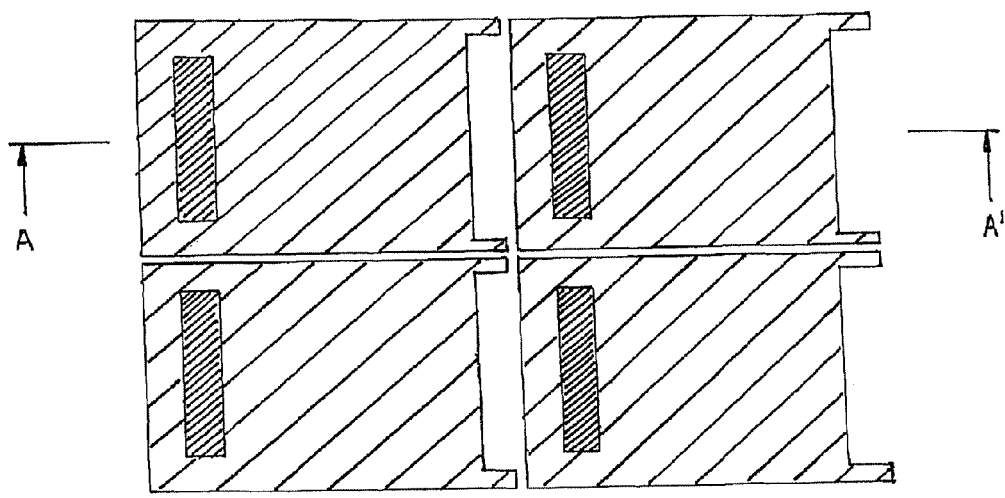
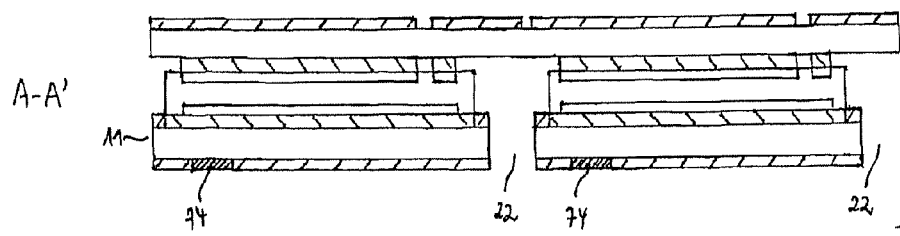
Fig. 117

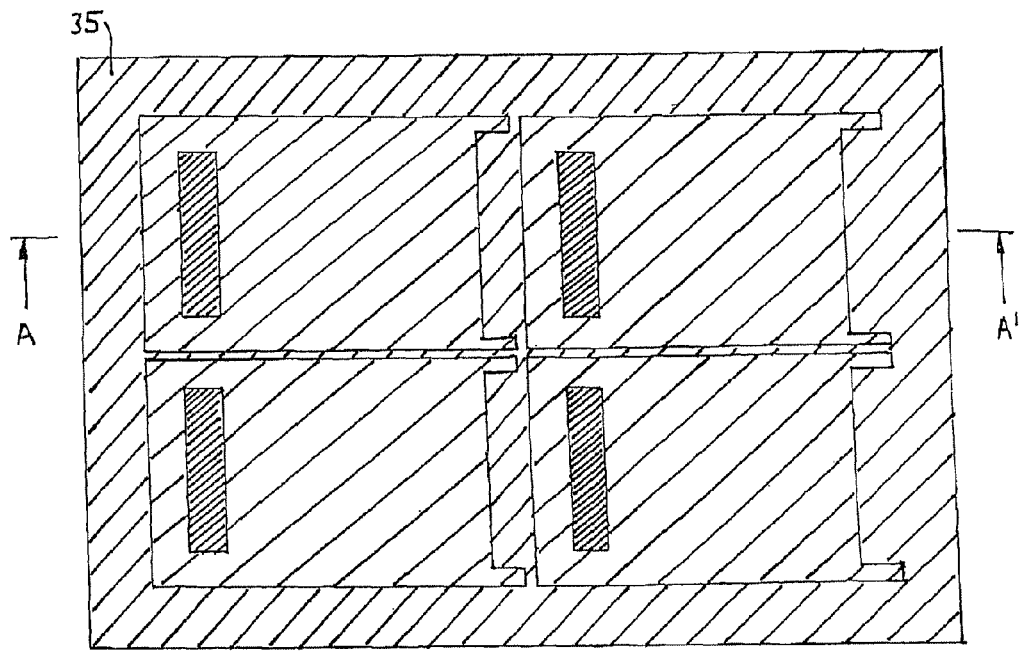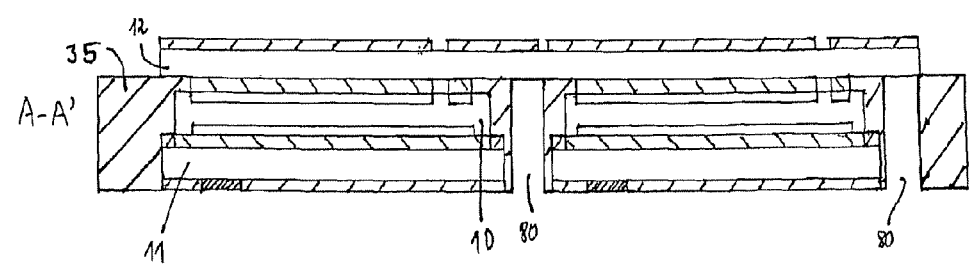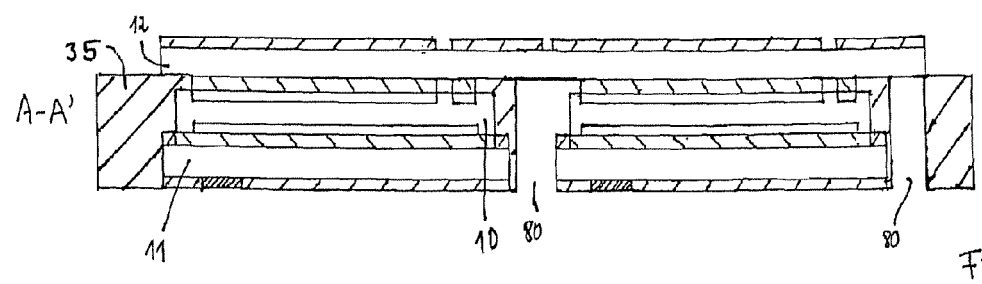
Fig. 11K

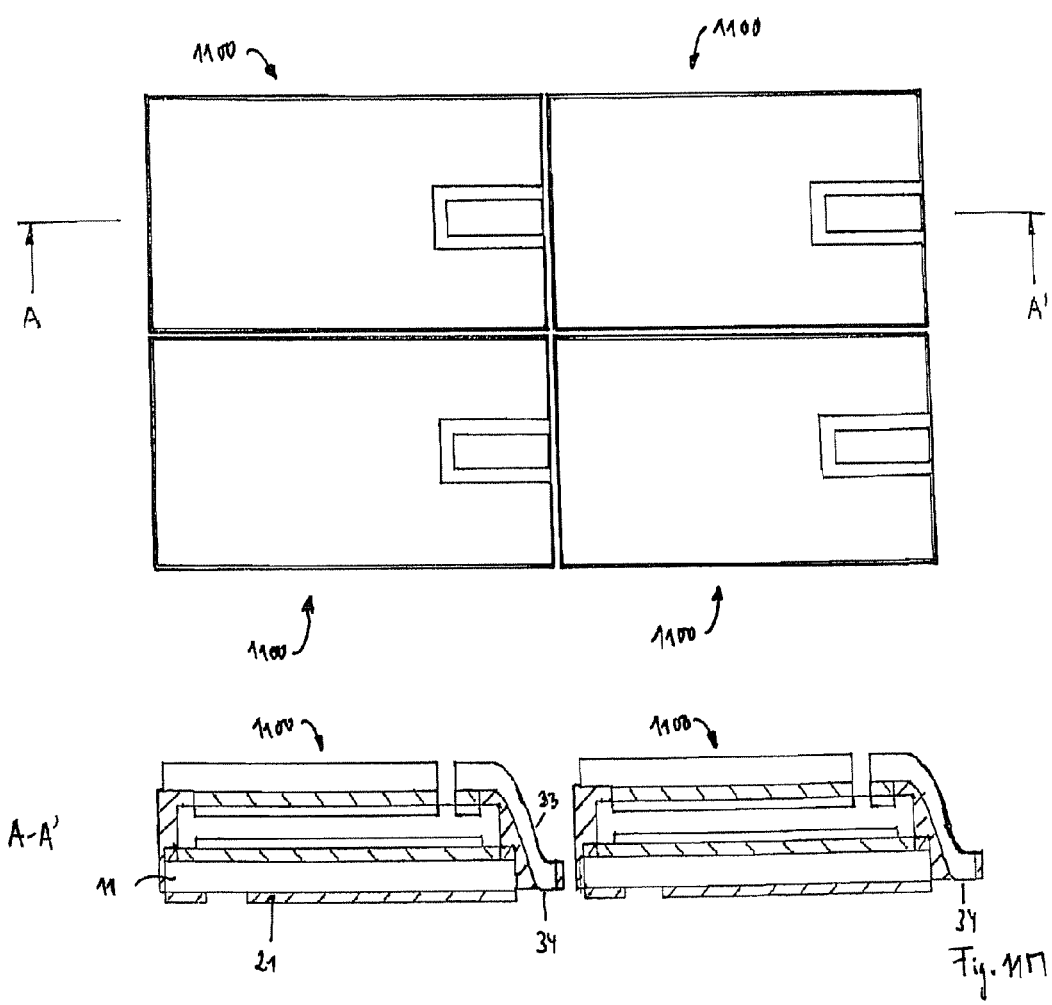

DEVICE INCLUDING A SEMICONDUCTOR CHIP AND METAL FOILS

BACKGROUND

This invention relates to a device including a semiconductor chip and metal foils as well as a method of manufacturing thereof.

The semiconductor chips included in the devices may be power semiconductor chips. Power semiconductor chips are suitable, in particular, for the switching and control of currents and/or voltages. Power semiconductor chips may, for example, be implemented as power MOSFETs, IGBTs, JFETs, power bipolar transistors or power diodes.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 schematically illustrates a cross-sectional view of one embodiment of a device including a semiconductor chip and two metal foils.

FIGS. 2A and 2B schematically illustrate a cross-sectional view of one embodiment of a method of manufacturing a device using a plurality of semiconductor chips and two metal foils.

FIGS. 3A to 3K schematically illustrate a cross-sectional view of one embodiment of a method of manufacturing a device including a power semiconductor chip arranged between two metal foils.

FIGS. 4A to 4D schematically illustrate a cross-sectional view of a variation of the method illustrated in FIGS. 3A to 3K.

FIGS. 5A and 5B schematically illustrate cross-sectional views of embodiments of devices mounted on circuit boards.

FIG. 8 schematically illustrates a cross-sectional view of one embodiment of a device including a two power semiconductor chips arranged as a half-bridge circuit.

FIG. 9 illustrates a basic circuit of a half-bridge circuit.

FIGS. 11A to 11M schematically illustrate a cross-sectional view of one embodiment of a method of manufacturing a device including a power semiconductor chip arranged between two metal foils.

DETAILED DESCRIPTION

Figure 3C:
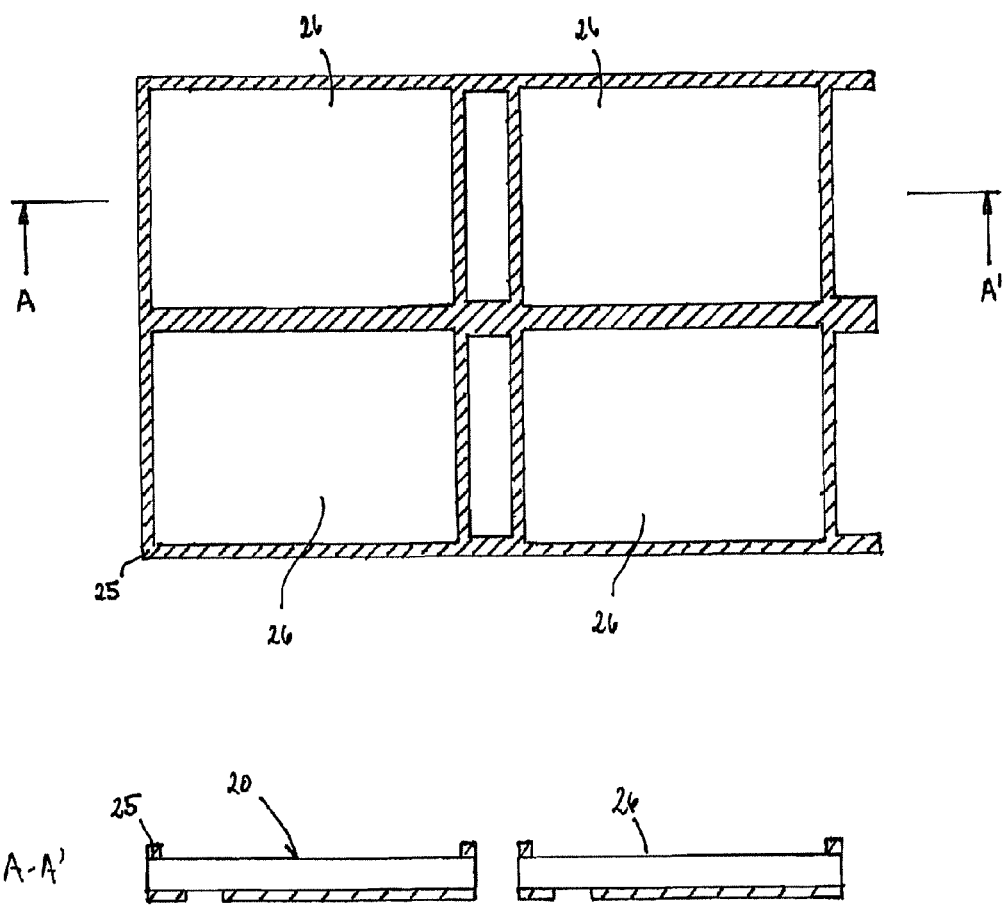

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Devices containing one or more semiconductor chips are described below. The semiconductor chips may be of different types, may be manufactured by different technologies and may include for example integrated electrical, electro-optical or electro-mechanical circuits and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. Semiconductor chips having a vertical structure may be involved, that is to say that the semiconductor chips may be fabricated in such a way that electric currents can flow in a direction perpendicular to the main faces of the semiconductor chips. A semiconductor chip having a vertical structure may have contact elements, for example, on its two main faces, that is to say on its top side and bottom side. Power semiconductor chips may have a vertical structure. By way of example, the source electrode and gate electrode of a power MOSFET may be situated on one main face, while the drain electrode of the power MOSFET is arranged on the other main face. Furthermore, the devices described below may include integrated circuits to control the integrated circuits of other semiconductor chips, for example the integrated circuits of power semiconductor chips. The semiconductor chips need not be manufactured from specific semiconductor material, for example Si, SiC, SiGe, GaAs, GaN, and, furthermore, may contain inorganic and/or organic materials that are not semiconductors, such as for example insulators, plastics or metals.

The semiconductor chips have electrodes (or contact pads) which allow electrical contact to be made with the integrated circuits included in the semiconductor chips. One or more metal layers may be applied to the electrodes of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The electrodes may be situated on the active main faces of the semiconductor chips or on other faces of the semiconductor chips.

The devices may contain one or more metal foils. The metal foils may be fabricated from metals or metal alloys, for example, copper, copper alloys, iron nickel, aluminum, aluminum alloys, or other appropriate materials. The metal foils may be plated with an electrically conductive material, for example copper, silver, iron nickel or nickel phosphorus. The metal foils may, for example, be used to produce a redistribution layer. The metal foils may be used as wiring layers to make electrical contact with the semiconductor chips from outside the devices or to make electrical contact with other semiconductor chips and/or components contained in the devices. The metal foils may be manufactured with any desired geometric shape. The metal foils may, for example, be composed of conductor tracks, but may also be in the form of a layer covering an area. The metal foils may be divided in the course of the fabrication, which may be carried out by sawing, a laser beam, cutting, stamping, milling, etching or any other appropriate method.

The devices may include electrically insulating material. The electrically insulating material may cover any fraction of any number of faces of the components of the device, such as the metal foils and the semiconductor chip integrated in the device. The electrically insulating material may serve various functions. It may be used, for example, to electrically insulate components of the device from each other and/or from external components, but it may also be used as a platform to mount other components, for example wiring layers or contact elements. The electrically insulating material may be fabricated using various techniques, for example using stencil printing, screen printing or any other appropriate printing technique. Furthermore, the electrically insulating material may be deposited from a gas phase or a solution or may be laminated as foils. The electrically insulating material may, for example, be made from organic materials, such as imide, epoxy or other thermosetting materials, photoresist, silicon nitride, metal oxides, silicone, semiconductor oxides, ceramics or diamond-like carbon. Furthermore, a mold material may be used as the electrically insulating material. The mold material may be any appropriate thermoplastic or thermosetting material. Various techniques may be employed to cover the components with the mold material, for example compression molding, injection molding, powder molding or liquid molding.

The devices described below include external contact elements (or external contact surfaces), which may be of any shape, size and material. The external contact elements may be accessible from outside the device and may thus allow electrical contact to be made with the semiconductor chips from outside the device. Furthermore, the external contact elements may be thermally conductive and may serve as heat sinks for dissipating the heat generated by the semiconductor chips. The external contact elements may be composed of any desired electrically conductive material. The external contact elements may include external contact pads. Solder material may be deposited on the external contact pads. The solder material may be embodied as solder deposits and may, for example, be composed of SnPb, SnAg, SnAgCu, SnAgCuNi, SnAu, SnCu and/or SnBi.

FIG. 1 schematically illustrates a cross-sectional view of a device 100. The device 100 includes a semiconductor chip 10, a first metal foil 11 and a second metal foil 12. The semiconductor chip 10 has a first electrode 13 arranged on a first face 14 of the semiconductor chip 10 and a second electrode 15 arranged on a second face 16 of the semiconductor chip 10. The first metal foil 11 is attached to the first electrode 13 in an electrically conductive manner. The second metal foil 12 is attached to the second electrode 15 in an electrically conductive manner.

FIGS. 2A and 2B schematically illustrate a cross-sectional view of one embodiment of a method. As illustrated in FIG. 2A, a first metal foil 11 and a second metal foil 12 are provided. Furthermore, a plurality of semiconductor chips 10 is provided. Each semiconductor chip 10 has a first electrode 13 arranged on a first face 14 of the respective semiconductor chip 10 and a second electrode 15 arranged on a second face 16 of the respective semiconductor chip 10. As illustrated in FIG. 2B, the first metal foil 11 is attached to the first electrodes 13 of the semiconductor chips 10 in an electrically conductive manner, and the second metal foil 12 is attached to the second electrodes 15 of the semiconductor chips 10 in an electrically conductive manner.

FIGS. 3A to 3K schematically illustrate one embodiment of a method of manufacturing a device 300, which is illustrated in FIG. 3K. The device 300 is an implementation of the device 100 illustrated in FIG. 1. The details of the device 300 that are described below can therefore be likewise applied to the device 100. Similar or identical components of the devices 100 and 300 are denoted by the same reference numerals. Furthermore, the method illustrated in FIGS. 3A to 3K is an implementation of the method illustrated in FIGS. 2A and 2B. The details of the method that are described below can therefore be likewise applied to the method of FIGS. 2A and 2B.

As illustrated in FIG. 3A, a first metal foil 11 is provided. The first metal foil 11 is illustrated in a top plan view (top) and a cross-sectional view (bottom) along the line A-A' depicted in the top plan view. The first metal foil 11 may be made of a rigid material, for example a metal or a metal alloy, such as copper, aluminum, nickel, CuFeP, steel or stainless steel. Moreover, the first metal foil 11 may be plated with an electrically conductive material, for example copper, silver, iron nickel or nickel phosphorus. The first metal foil 11 may have a flat or planar first face 20 on which the semiconductor chips 10 are placed later on. Moreover, the first metal foil 11 may have a flat or planar second face 21 opposite to the first face 20. The shape of the first metal foil 11 is not limited to any geometric shape, and the first metal foil 11 may have any appropriate size. For example, the thickness $d_1$ of the first metal foil 11 may be in the range from 30 μm to 1.3 mm and in one embodiment from 50 to 150 μm and from 70 to 120 μm. The thickness $d_1$ of the first metal foil 11 may in one embodiment be chosen such that the first metal foil 11 has an appropriate heat capacity in a direction orthogonal to the first face 20. Furthermore, the first metal foil 11 may be structured. In the embodiment illustrated in FIG. 3A, the first metal foil 11 has recesses (or through-holes) 22 each of them extending from the first face 20 to the second face 21 of the first metal foil 11. Structuring of the first metal foil 11 in order to produce the recesses 22 may have been carried out prior to the method illustrated in FIGS. 3A to 3K using mechanical sawing, a laser beam, cutting, stamping, milling, etching or any other appropriate method.

An electrically insulating material 23 may be deposited on the second face 21 of the first metal foil 11 as illustrated in FIG. 3B. The deposition of the electrically insulating material 23 may, for example, be performed by stencil printing, screen printing or any other appropriate printing technique. The electrically insulating material 23 may be laminated as a foil or sheet onto the first metal foil 11 by applying vacuum as well as heat and pressure for a suitable time. It may also be provided that the electrically insulating material 23 is deposited from a solution or a gas phase and may be built-up in a layer-by-layer fashion to a desired thickness. Techniques that can be employed for this kind of deposition are, for example, physical or chemical vapor deposition, spinning, dispensing, dipping or spraying. The electrically insulating material 23 may be fabricated from polymer material, such as parylene, photoresist material, imide, epoxy, duroplast, silicone, silicon nitride or an inorganic, ceramic-like material, such as silicone-carbon compounds.

The electrically insulating material 23 may be structured as illustrated in FIG. 3B. A plurality of recesses 24 are created in the electrically insulating material 23. The recesses 24 expose portions of the second face 21 of the first metal foil 11.

The recesses 24 may be produced when printing the electrically insulating material 23 on the first metal foil 11. Moreover, if the electrically insulating material 23 contains photoactive components, the electrically insulating material 23 may be photo-lithographically structured. The electrically insulating material 23 may, for example, be structured by laser ablation, mechanical drilling or any other suitable process known to a person skilled in the art.

In one embodiment, not illustrated in the Figures, the electrically insulating material 23 is provided as a polymer foil or sheet with a plurality of recesses 24 before it is laminated onto the first metal foil 11. The recesses 24 may be provided by stamping out regions of the polymer foil or sheet.

The distance $d_2$ between the recesses 24 in the electrically insulating material 23 and the recesses 22 in the first metal foil 11 may depend on the semiconductor chips 10 which are placed on the first metal foil 11 later on and on the voltages applied to the semiconductor chips 10 during their operation. For example, if a voltage of 1 kV is applied to the semiconductor chips 10, the distance $d_2$ may be typically around 2.9 mm.

As illustrated in FIG. 3C, an electrically insulating material 25 may be deposited on the first face 20 of the first metal foil 11. For the deposition of the electrically insulating material 25 the same deposition methods may be used as described above in connection with the deposition of the electrically insulating material 23. For example, the electrically insulating material 25 may be printed on the first face 20 of the first metal foil 11. Furthermore, the same materials may be used for the electrically insulating material 25 as described above in connection with the electrically insulating material 23.

The electrically insulating material 25 may be applied such that sections 26 of the first face 20 of the first metal foil 11 are exposed as illustrated in FIG. 3C. In other words, the electrically insulating material 25 forms frames around the sections 26. Each of the exposed sections 26 may have a surface area similar to the surface area of the first or second faces 14, 16 of the semiconductor chips 10. The sections 26 may be arranged in an array.

Figure 3D:
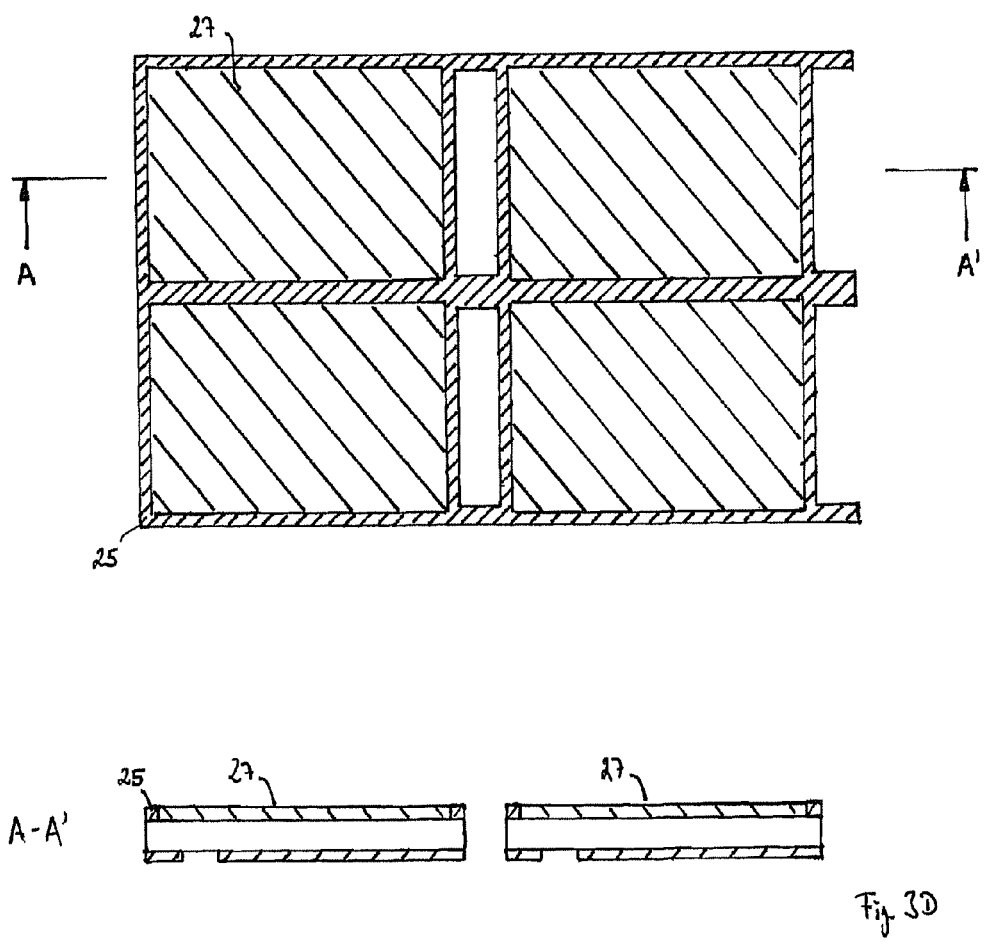
Figure 3F:
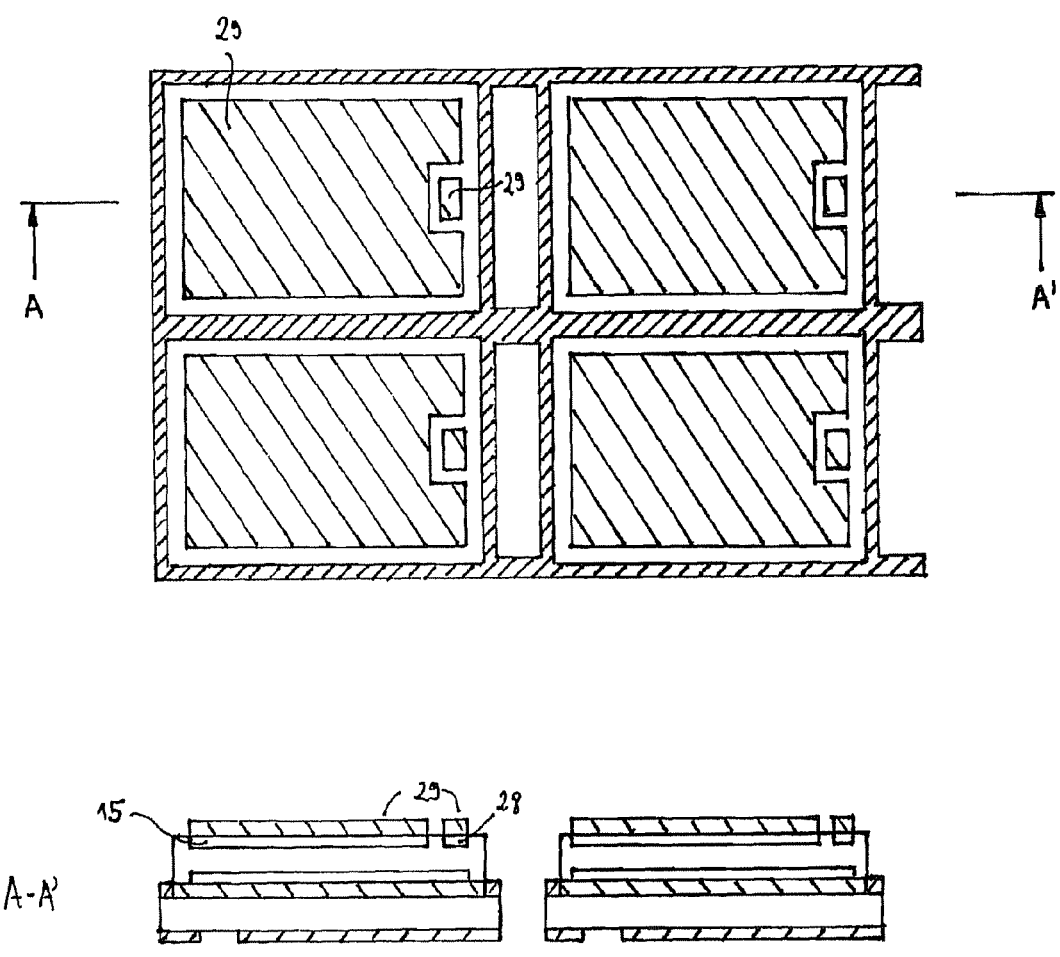
Figure 37:
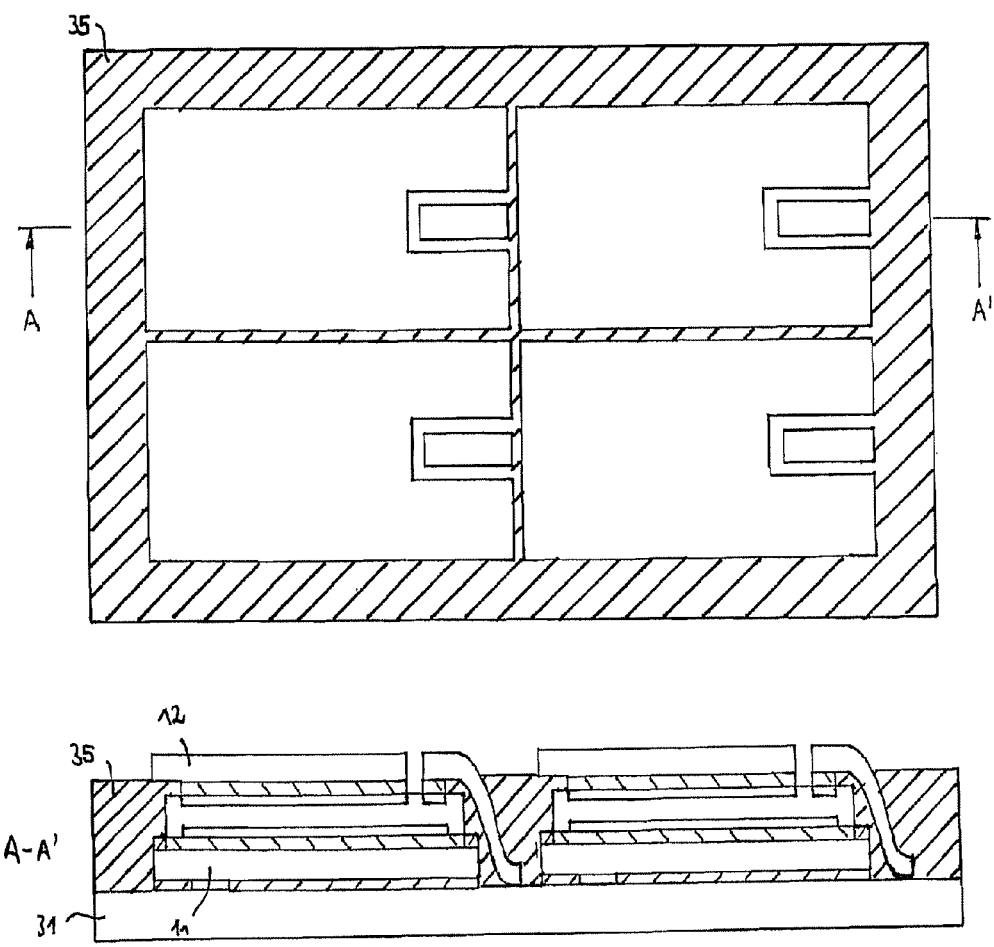

The sections 26 exposed from the electrically insulating material 25 may be covered with a solder material 27 as illustrated in FIG. 3D. The solder material 27 may, for example, be SnPb, SnAg, SnAgCu, SnAgCuNi, SnAu, SnCu and/or SnBi. During its deposition the solder material 27 may be a solder paste, which is, for example, deposited by stencil printing, screen printing or any other appropriate deposition technique. The height of the solder layer 27 may be equal to the height of the electrically insulating layer 25, but may also be different.

As an alternative to the solder material 27, other electrically conductive materials, such as electrically conductive adhesive or metal (nano-)particles, may be deposited on the exposed sections 26. The electrically conductive adhesive may be based on epoxy resins or silicone and be enriched with gold, silver, nickel or copper in order to produce the electrical conductivity. The metal particles may, for example, be made of a metal, such as silver, gold, copper, tin or nickel. The extensions (average diameter) of the metal particles may be smaller than 100 nm and smaller than 50 nm or 10 nm. It may also be provided that only a fraction of the metal particles has such dimensions. For example, at least 10% or 20% or 30% or 40% or 50% or 60% or 70% of the metal particles may have dimensions smaller than 100 nm or 50 nm or 10 nm. The other metal particles may have larger dimensions.

As a further alternative, the solder material 27 (or the electrically conductive adhesive or the metal particles) is not deposited on the first metal foil 11, but the first faces 14 of the semiconductor chips 10 are coated with these materials. Moreover, if non-creeping materials are used to establish the electrical connection between the first metal foil 11 and the semiconductor chips 10, the deposition of the material 25 may also be omitted.

As illustrated in FIG. 3E, the semiconductor chips 10 may be placed over the first face 20 of the first metal foil 11, a respective one of the semiconductor chips 10 may be placed over each of the sections 26. Any number of the semiconductor chips 10 may be placed over the first metal foil 11, for example at least two semiconductor chips 10. In FIG. 3E four semiconductor chips 10 are illustrated, however further semiconductor chips 10 may additionally be placed over the first metal foil 11 which are not illustrated in FIG. 3E. For example, more than 50 or 100 or 500 semiconductor chips 10 may be placed over the first metal foil 11. The semiconductor chips 10 may be arranged in an array. The semiconductor chips 10 are relocated on the first metal foil 11 in larger spacing as they have been in the wafer bond. Some of the semiconductor chips may be also placed on the first metal foil with almost no space between them and some of the semiconductor chips may not have been separated yet such that they are still in the wafer bond. The semiconductor chips 10 may have been manufactured on the same semiconductor wafer, but may have been manufactured on different wafers. Furthermore, the semiconductor chips 10 may be physically identical, but may also contain different integrated circuits and/or represent other components and/or may have different outer dimensions and/or geometries. The semiconductor chips 10 may have a thickness in the range between 50 μm and several hundred micrometers, in the range between 60 and 80 μm. The semiconductor chips 10 may be placed over the first metal foil 11 with their first faces 14 facing the first metal foil 11 and their second faces 16 facing away from the first metal foil 11.

Each of the semiconductor chips 10 may have a first electrode 13 on the first face 14 and a second electrode 15 on the second face 16. The first and second electrodes 13, 15 may be load electrodes. Furthermore, each of the semiconductor chips 10 may have a third electrode 28 on its second face 16 functioning as a control electrode. The electrodes 13, 15 and 28 may also be arranged differently from the illustration of FIG. 3E. For example, the control electrodes 28 may be arranged in the corners of the second faces 16 of the semiconductor chips 10. Moreover, the first electrodes 13 may extend to the side faces of the semiconductor chips 10 and may even cover portions of the side faces. The semiconductor chips 10 may be configured as power semiconductor chips and may include power diodes or power transistors, for example power MOSFETs, IGBTs, JFETs or power bipolar transistors. In the case of a power MOSFET or a JFET, the first load electrode 13 is a drain electrode, the second load electrode 15 is a source electrode, and the control electrode 28 is a gate electrode. In the case of an IGBT, the first load electrode 13 is a collector electrode, the second load electrode 15 is an emitter electrode, and the control electrode 28 is a gate electrode. In the case of a power bipolar transistor, the first load electrode 13 is a collector electrode, the second load electrode 15 is an emitter electrode, and the control electrode 28 is a base electrode. In case of a power diode, the first and second load electrodes 13 and 15 are cathode and anode. During operation, voltages of up to 5, 50, 100, 500 or 1000 V or even higher may be applied between the load electrodes 13 and 15. The switching frequency applied to the control electrode 28 may be in the range from 1 kHz to 500 kHz for CMOS semiconductor chips 10 and may be up to several GHz when using semiconductor chips 10 manufactured by certain technologies such as bipolar power transistors. Moreover, the semiconductor chips 10 may also be operated without switching the potential of the control electrode 28.

After the placement of the semiconductor chips 10, the solder material 27 may be cured by a heat treatment at moderate temperatures, for example temperatures between 100 and 120° C., for about 30 minutes. During the curing process solvent contained in the solder material 27 may evaporate. The heat treatment may be performed by using a hot plate or an oven. If electrically conductive adhesive or metal particles are used instead of the solder material 27, the heat treatment may be omitted or may be carried out at adjusted temperatures.

Solder material 29 may be deposited on the second electrodes 15 and the control electrodes 28 of the semiconductor chips 10, for example by stencil printing, screen printing or any other appropriate deposition technique. The solder material 29 may be deposited such that the solder material deposited on the second electrode 15 of one of the semiconductor chips 10 is not in contact with the solder material 29 deposited on the control electrode 28 of the same semiconductor chip 10. Instead of the solder material 29, electrically conductive adhesive or metal (nano-)particles may be deposited. Furthermore, the deposition of the solder material 29 (or the electrically conductive adhesive or the metal particles) may be omitted if the solder material 29 (or the electrically conductive adhesive or the metal particles) has been deposited on the semiconductor chips 10 prior to placing them over the first metal foil 11.

The deposition of the solder material 29 may be followed by another heat treatment at moderate temperatures, for example temperatures between 100 and 120° C., for about 30 minutes in order to cure the solder material 29. If electrically conductive adhesive or metal particles are used instead of the solder material 29, the heat treatment may be omitted or may be carried out at adjusted temperatures. Furthermore, the curing of the solder materials 27 and 29 may be carried out at the same time.

As illustrated in FIG. 3G, a second metal foil 12 is placed over the semiconductor chips 10. The second metal foil 12 may be made of a rigid material, for example a metal or a metal alloy, such as copper, aluminum, nickel, CuFeP, steel or stainless steel. Moreover, the second metal foil 12 may be plated with an electrically conductive material, for example copper, silver, iron nickel or nickel phosphorus. The second metal foil 12 may have flat or plane top and bottom faces. The shape of the second metal foil 12 is not limited to any geometric shape, and the second metal foil 12 may have any appropriate size. For example, the thickness $d_3$ of the second metal foil 12 may be in the range from 30 μm to 1.3 mm and from 50 to 150 μm and from 70 to 120 μm. The thickness of the second metal foil 12 may be similar to the thickness of the first metal foil 11, or the second metal foil 12 may be thinner than the first metal foil 11. The thickness of the second metal foil 12 may be chosen such that it allows bending of the second metal foil 12.

The second metal foil 12 may be structured. In the embodiment illustrated in FIG. 3G, the second metal foil 12 has an array of recesses 30 each of them extending from the top face to the bottom face of the second metal foil 12. Structuring of the second metal foil 12 in order to produce the recesses 30 may have been carried out prior to the method illustrated in FIGS. 3A to 3K using sawing, a laser beam, cutting, stamping, milling, etching or any other appropriate method. The second metal foil 12 may be placed over the semiconductor chips 10 such that each of the recesses 30 is arranged between the second load electrode 15 and the control electrode 28 of a respective one of the semiconductor chips 10.

The second metal foil 12 may also include small holes which are not illustrated in FIG. 3G. These holes may allow outgassing of the solder material 29 or the electrically conductive adhesive. The holes may be produced by stamping, etching or any other appropriate technique.

Subsequent to the placement of the second metal foil 12, a temperature high enough to melt the solder materials 27 and 29 may be applied. This temperature may, for example, be in the range between 260 and 390° C. Melting the solder materials 27 and 29 leads to soldered joints between the first metal foil 11 and the semiconductor chips 10 as well as the second metal foil 12 and the semiconductor chips 12. As a result, the first and second metal foils 11, 12 and the semiconductor chips 10 firmly adhere together. If the electrically conductive adhesive is used instead of the solder materials 27 and 29, a temperature may be applied sufficient to cure and thereby harden the electrically conductive adhesive. This temperature may, for example, be in the range between 150 and 200° C. If metal (nano-)particles are used instead of the solder materials 27 and 29, a temperature high enough to sinter the metal particles may be applied. This temperature may, for example, be higher than 150 or 200° C. and depends on the diameter of the metal particles.

As illustrated in FIG. 3H, the first and second metal foils 11, 12 may be divided thereby separating the semiconductor chips 10 from one another, for example by sawing, cutting, milling or laser ablation. Prior to dividing the first and second metal foils 11, 12, they may be placed on a carrier 31, which may have a soft and sticky surface to allow the electrically insulating layer 23 to sink slightly into the carrier 31. For that purpose, the carrier 31 may, for example, contain silicone or any other appropriate material. The second metal foil 12 may be divided such that portions 32 of the second metal foil 12 which are electrically coupled to the second electrodes 15 of the semiconductor chips 10 and portions 33 of the second metal foil 12 which are electrically coupled to the control electrodes 28 are arranged over the recesses 22 in the first metal foil 11. The portions 32 and 33 connected to one of the semiconductor chips 10 are exemplarily indicated in FIG. 3H by dashed lines. Furthermore, the second metal foil 12 may be divided such that the second electrode 15 and the control electrode 28 of each semiconductor chip 10 are electrically insulated from each other by the respective recess 30.

After the separation of the first and second metal foils 11, 12 the portions 32 and 33 of the second metal foil 12, which overlap the recesses 22 in the first metal foil 11, may be bent such that surfaces 34 of the second metal foil 12 lie essentially in the plane defined by the second face 21 of the first metal foil 11 or in a plane parallel to this plane as illustrated in FIG. 3I. The ends of the bent portions 32 and 33 are located in the recesses 22 formed in the first metal foil 11. Bending to the second metal foil 12 may be carried out using appropriate tools. It is to be noted that for better illustration the components illustrated in FIGS. 3A to 3K are compressed for about a factor of 10 in a direction orthogonal to the main faces of the semiconductor chips 10.

After or before the bending of the second metal foil 12, an electrically insulating material 35 may be applied to the carrier 31 and the components placed on the carrier 31 as illustrated in FIG. 3J. The electrically insulating material 35 may cover the side faces of the first metal foil 11 and other faces. The electrically insulating material may however not cover the top face of the second metal foil 12. Furthermore, the electrically insulating material may not cover the recesses 24 in the electrically insulating material 23 exposing portions of the second face 21 of the first metal foil 11 because the recesses 24 are protected by the carrier 31. The electrically insulating material 35 may, for example, include silicone and may be applied when fluid, thin fluid or viscous. After its application the electrically insulating material 35 may be cured at an appropriate temperature.

As illustrated in FIG. 3K, the electrically insulating material 35 may be divided thereby separating the devices 300 from one another, for example by sawing, cutting, milling or laser ablation. Furthermore, the devices 300 may be released from the carrier 31. The devices 300 may be separated such that the side faces of the first metal foil 11 are still coated with the electrically insulating material 35.

It is obvious to a person skilled in the art that the devices 300 are only intended to be an exemplary embodiment, and many variations are possible. Although each of the devices 300 in the embodiment illustrated in FIG. 3K includes exactly one semiconductor chip, which is the power semiconductor chip 10, the devices 300 may include two or more semiconductor chips and/or passives. The semiconductor chips and passives may differ in function, size, manufacturing technology etc. For example, a semiconductor chip controlling the power semiconductor chip 10 may be included in each of the devices 300.

Another variation of the method illustrated in FIGS. 3A to 3K is schematically illustrated in FIGS. 4A to 4D. The fabrication process illustrated in FIG. 4A corresponds to the fabrication process illustrated in FIG. 3E, where the semiconductor chips 10 are placed on the solder material 27 (or the electrically conductive adhesive or the metal particles).

Figure 4A:
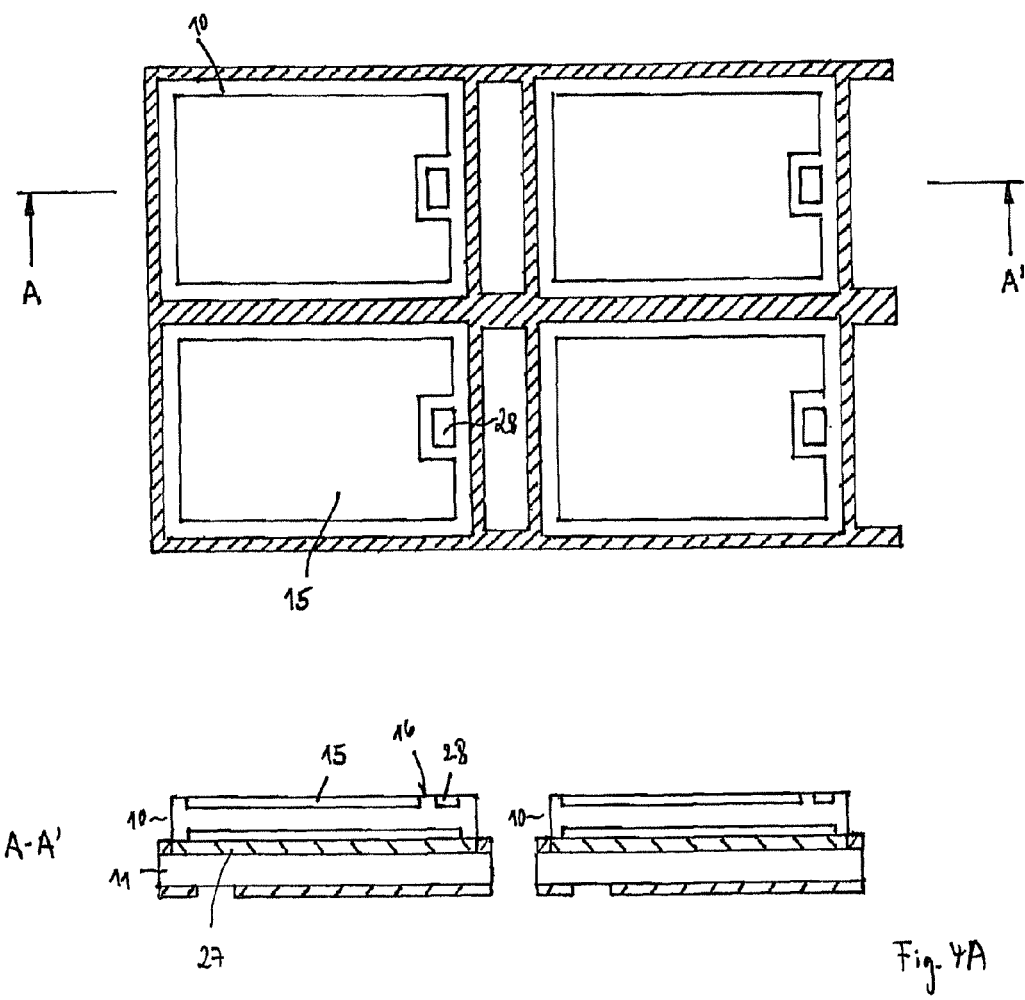
Figure 4B:
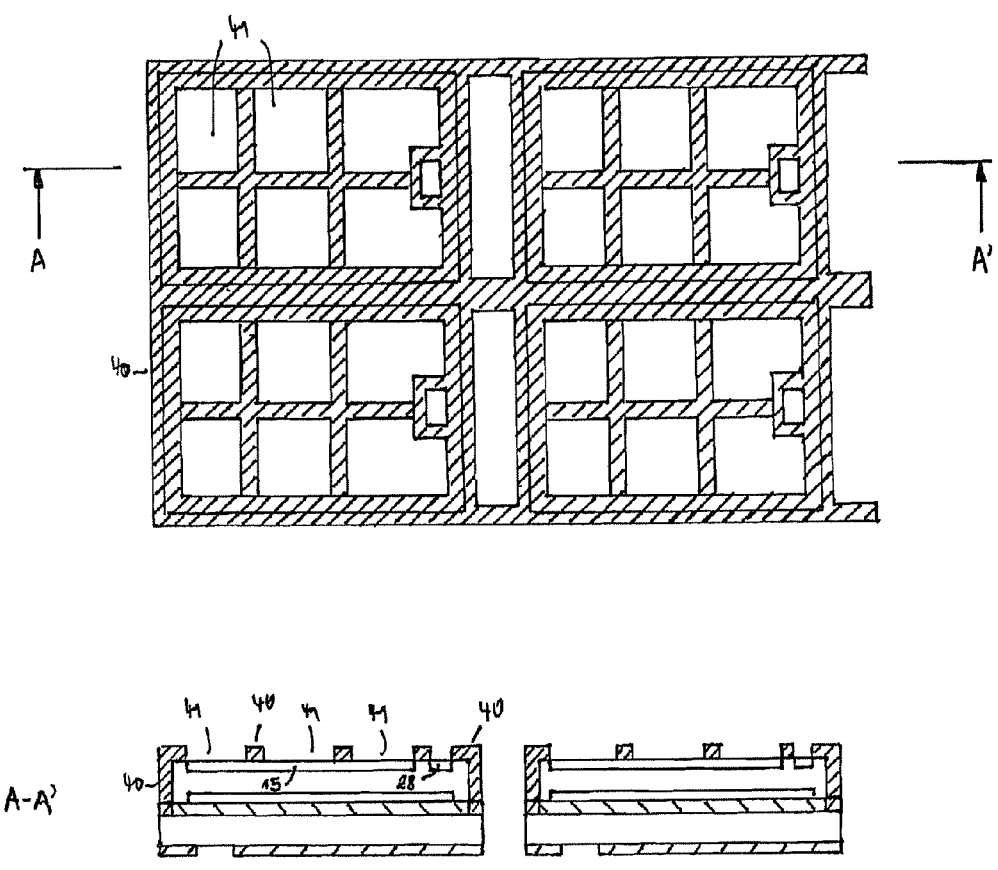

As illustrated in FIG. 4B, the side faces of the semiconductor chips 10 and portions of the second faces 16 of the semiconductor chips 10 may be covered with an electrically insulating material 40. The electrically insulating material 40 may, for example, be deposited between the second electrode 15 and the control electrode 28 of each semiconductor chip 10 in order to electrically insulated these two electrodes from each other. Furthermore, the electrically insulating material 40 may be applied such that arrays of uncovered areas 41 are formed on the second electrodes 15 of the semiconductor chips 10. For the deposition of the electrically insulating material 40 the same deposition methods may be used as described above in connection with the deposition of the electrically insulating material 23, for example, printing methods may be used. Furthermore, the same materials may be used for the electrically insulating material 40 as described above in connection with the electrically insulating material 23.

Figure 4C:
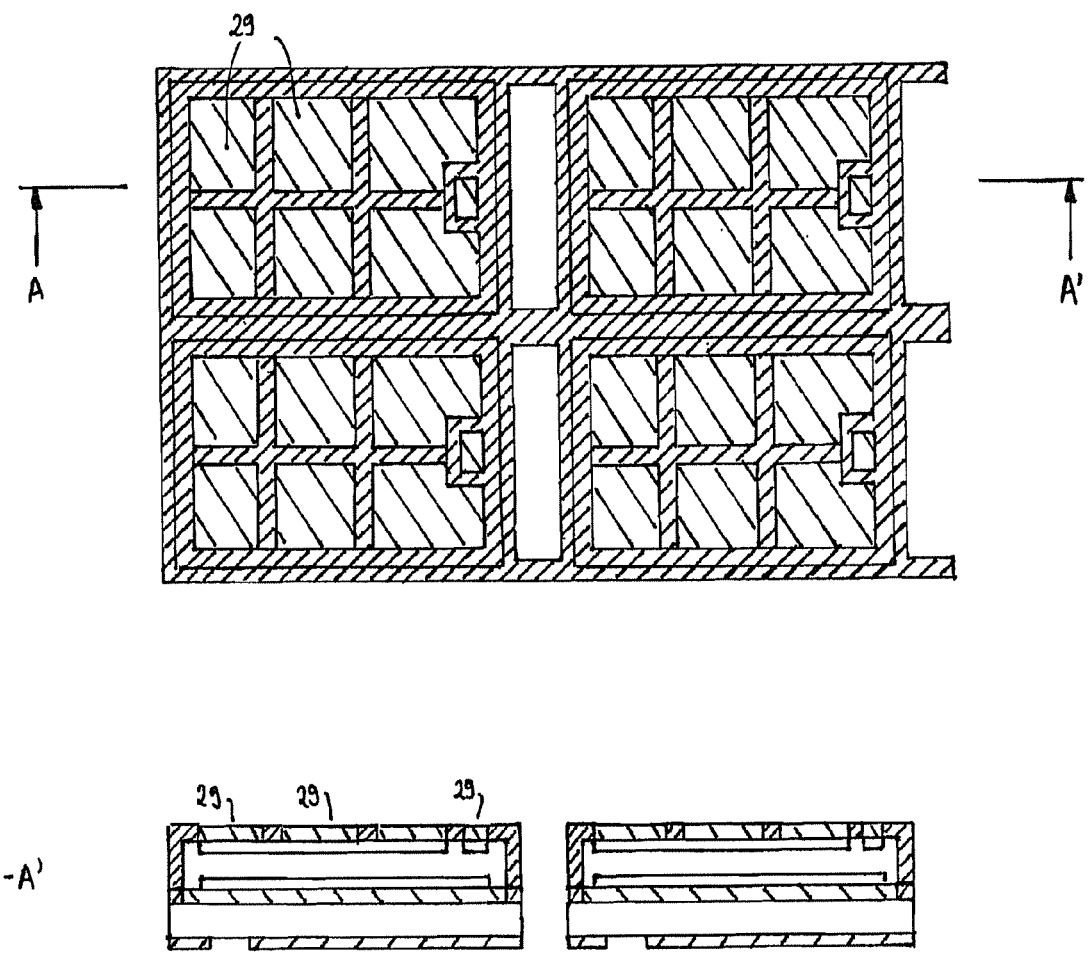

The solder material 29 (or the electrically conductive adhesive or the metal particles) may be deposited on the areas 41, which are not covered with the electrically insulating material 40, and the control electrodes 28 as illustrated in FIG. 4C.

Subsequently, the second metal foil 12 containing the recesses 30 may be placed over the semiconductor chips 10 as illustrated in FIG. 4D. The second metal foil 12 may be laminated onto the electrically insulating material 40 by applying vacuum as well as heat and pressure for a suitable time. The heat applied for the lamination of the second metal foil 12 may also melt the solder materials 27 and 29 which leads to solder joints between the first and second metal foils 11, 12 and the semiconductor chips 10. In case electrically conductive adhesive or metal particles are used instead of the solder materials 27 and 29, the heat applied for the lamination of the second metal foil 12 may cure the electrically conductive adhesive or sinter the metal particles. Afterwards, the same or similar fabrication processes may be performed as illustrated in FIGS. 3H to 3K.

FIG. 5A schematically illustrates a cross-sectional view of a system 500. The system 500 includes the device 300, a cooling element 50 and a circuit board 51. The device 300 is less compressed in the direction orthogonal to the main faces of the semiconductor chip 10 in FIG. 5A when compared to FIG. 3K. The device 300 is mounted on the circuit board 51 with its mounting surface, which is the second face 21 of the first metal foil 11, facing the circuit board 51. The circuit board 51 may be a PCB (printed circuit board) and may include contact pads 52 on its top face to which the device 300 is attached. For example, the external contact surfaces of the device 300 may have been soldered to the contact pads 52 of the circuit board 51 by using solder deposits 53 (and surface-mount technology). The external contact surfaces of the device 300 are the surface 24 of the first metal foil 11, which is electrically coupled to the first electrode 13 of the semiconductor chip 10, and the surfaces 34 of the second metal foil 12, which lie essentially in the plane defined by the second face 21 of the first metal foil 11 and which are electrically coupled to the second electrode 15 and the control electrode 28, respectively, of the semiconductor chip 10. The surface 34 of the second metal foil 12, which is electrically coupled to the second electrode 15 is not illustrated in FIG. 5A.

The cooling element 50 (or heat sink) may be attached on top of the device 300. The cooling element 50 may be electrically insulated from the top face of the second metal foil 12 (not illustrated). For example, an electrically insulating layer made of a foil, a paste or any other electrically insulating material having a sufficient thermal conductivity may be arranged between the second metal foil 12 and the cooling element 50. The cooling element 50 dissipates the heat generated by semiconductor chip 10 included in the device 300 during operation. In case the cooling element 50 is directly attached to the second metal foil 12, the cooling element 50 may be only attached to the portion of the second metal foil 12 which is electrically coupled to the second electrode 15 of the semiconductor chip 10 and not the control electrode 28.

Further devices, which are not illustrated in FIG. 5, may be additionally mounted on the circuit board 51. For example, a control device may be mounted on the circuit board 51 and may be configured to control the device 300. The control device may drive the electrical potential of the control electrode 28, thus controlling the switching of the semiconductor chip 10.

FIG. 5B schematically illustrates a cross-sectional view of a system 501. The system 501 is similar to the system 500, but contains a device 301 in which the second face 16 of the semiconductor chip 10 faces the first metal foil 11. Therefore the first metal foil 11 is structured for electrically contacting the second electrode 15 and the control electrode 28. The first electrode 13 is electrically coupled to the second metal foil 12. The device 301 may, for example, be manufactured by using a fabrication method analog to the method illustrated in FIGS. 3A to 3K.

Figure 6:
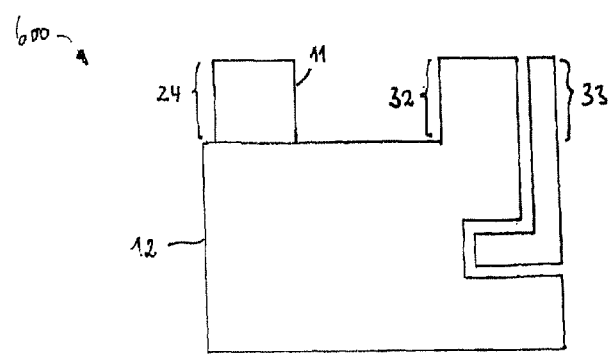
FIG. 6 schematically illustrates a cross-sectional view of one embodiment of a device including a power semiconductor chip and two metal foils.

A further variation of the device 300 is schematically illustrated in FIG. 6 in a top plan view. The device 600 illustrated in FIG. 6 can mounted on a circuit board using through-hole technology. For that purpose, the device 600 includes protruding external contact elements 24, 32 and 33 that can be inserted into holes drilled in a circuit board and soldered to pads on the opposite side of the circuit board. The external contact element 24 is part of the first metal foil 11 and electrically coupled to the first electrode 13 of the semiconductor chip 10. The external contact elements 32 and 33 are parts of the second metal foil 12 and electrically coupled to the second electrode 15 and the control electrode 28, respectively, of the semiconductor chip 10. In the present embodiment the second metal foil 12 may not be bent as illustrated in FIG. 3I. During production of the devices 600, the devices 600 may be arranged line by line each turned by 180° in the plane such that the protruding external contact elements 24, 32 and 33 of two neighboring devices 600 face each other and overlap.

Figure 7:
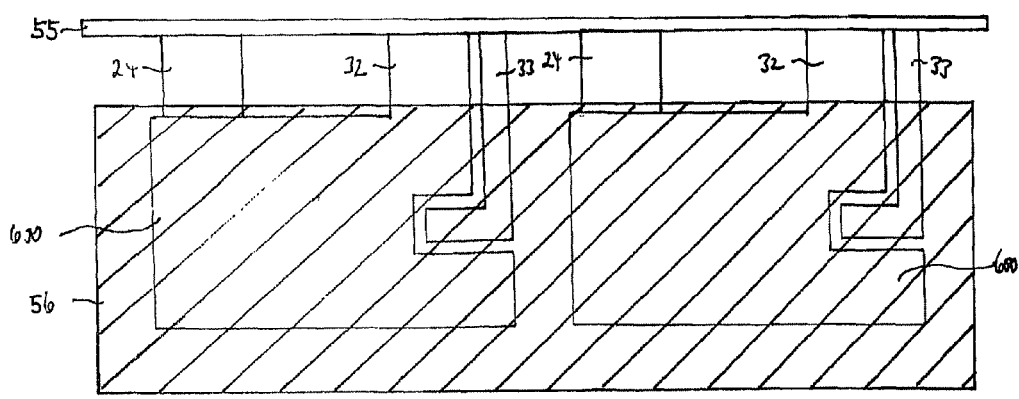
FIG. 7 schematically illustrates a cross-sectional view of a variation of the method illustrated in FIGS. 3A to 3K.

A further variation of the method illustrated in FIGS. 3A to 3K is schematically illustrated in FIG. 7. The fabrication process illustrated in FIG. 7 may replaced the fabrication process illustrated in FIG. 3J and may be applied to the device 600 illustrated in FIG. 6. As illustrated in FIG. 7, the external contact elements 24, 32 and 33 of devices 600 are attached to a magnetic foil (or chain or wire or cable) 55 such that the devices 600 are dipped in a bath 56 containing the electrically insulating material 35. As a result, the components of the devices 600 are coated with the electrically insulating material 35, but the external contact elements 24, 32 and 33 are left uncovered. In case the devices 300 are coated with the electrically insulating material 35 in the bath 56, the external contact surfaces 24 and 34 need to be protected before the device 300 is dipped into the bath 56.

FIG. 8 schematically illustrates a device 800 in a top plan view (top) and a cross-sectional view (bottom) along the line A-A' depicted in the top plan view. The device 800 may be fabricated using the method illustrated in FIGS. 3A to 3K. The device 800 may include the power semiconductor chip 10 and a further power semiconductor chip 60, which may be identical to the power semiconductor chip 10. Both power semiconductor chips 10 and 60 may be coupled to each other in a half-bridge circuit.

A basic circuit of a half-bridge 900 arranged between two nodes N1 and N2 is illustrated in FIG. 9. The half-bridge 900 consists of two switches S1 and S2 connected in series. Constant electrical potentials may be applied to the nodes N1 and N2. For example, a high electrical potential, such as 10, 50, 100, 200, 500 or 1000 V or any other potential, may be applied to the node N1 and a low electrical potential, for example 0 V, may be applied to the node N2. In this case the switch S1 is called high side switch and the switch S2 is called low side switch. The switches S1 and S2 may be switched at frequencies in the range from 1 kHz to 100 MHz, but the switching frequencies may also be outside this range.

In the device 800 the power semiconductor chips 10 and 60 may be implemented as the switches S1 and S2. The power semiconductor chip 60 may be mounted on the first metal foil 11 such that its second electrode 15 is coupled to the first metal foil 11. Furthermore, the first electrode 13 of the power semiconductor chip 10 is coupled to the second electrode 15 of the power semiconductor chip 60 by means of the first metal foil 11. The second metal foil 12 is structured such that the second electrode 15 of the power semiconductor chip 10 and the first electrode 13 of the power semiconductor chip 60 are electrically insulated from each other. Moreover, the control electrodes 28 of both semiconductor chips 10 and 60 are electrically insulated from the other electrodes. The device 800 may also be embodied as a SMD (surface mount device). In this case, the portions of the second metal foil 12 coupled to second electrode 15 and the control electrode 28 of the semiconductor chip 10 may be embodied as the respective components in the device 500. The portion of the second metal foil 12 coupled to the first electrode 13 of the semiconductor chip 60 may be embodied as the respective component in the device 501. Furthermore, the protruding external contact elements of both metal foils 11, 12 may be omitted. According to one embodiment, the first metal foil 11 may not electrically couple the first electrode 13 of the semiconductor chip 10 to the second electrode 15 of the semiconductor chip 60. This electrical connection may be established when mounting the device 800 on a circuit board.

The half-bridge device 800 may, for example, be implemented in electronic circuits for converting DC voltages, DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage. Frequencies of several MHz or higher may be applied to DC-DC converters. Furthermore, currents of up to 50 A or even higher may flow through the DC-DC converters.

Figure 10C:
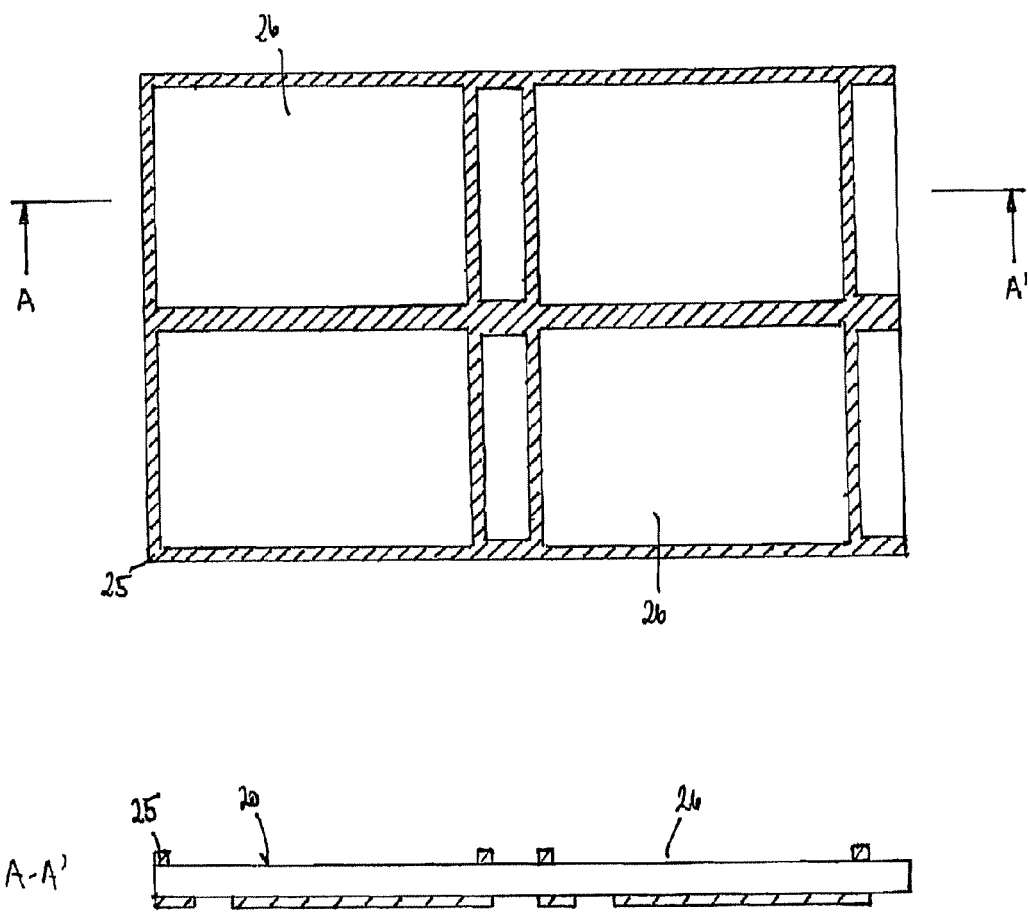
FIGS. 10A to 10L schematically illustrate a cross-sectional view of one embodiment of a method of manufacturing a device including a power semiconductor chip arranged between two metal foils.
Figure 10F:
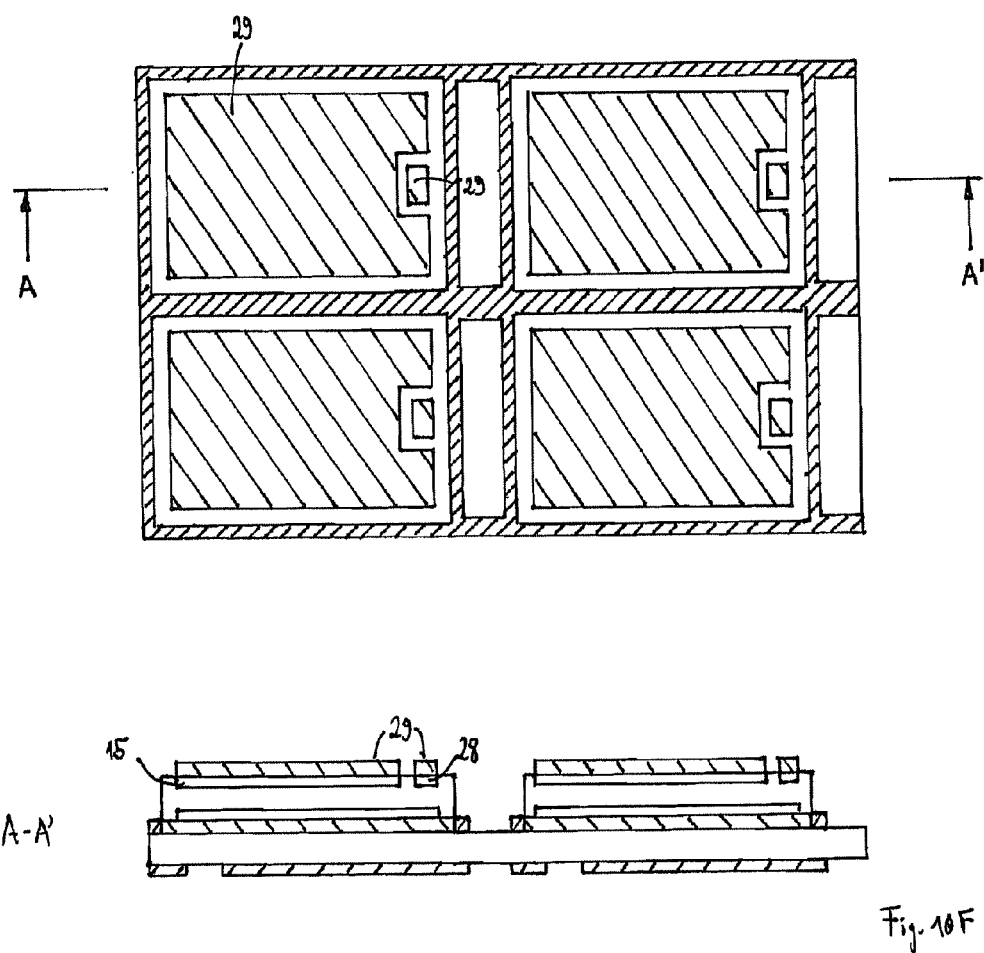
Figure 10:
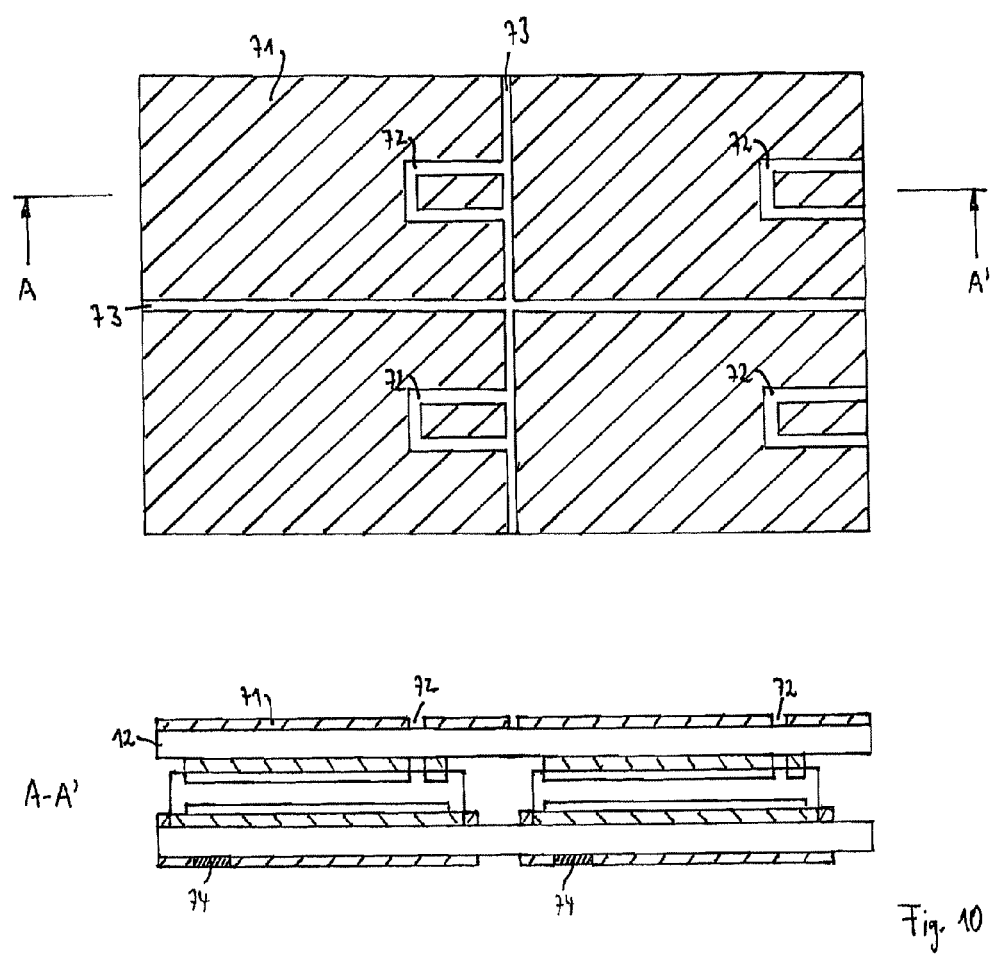
Figure 10K:
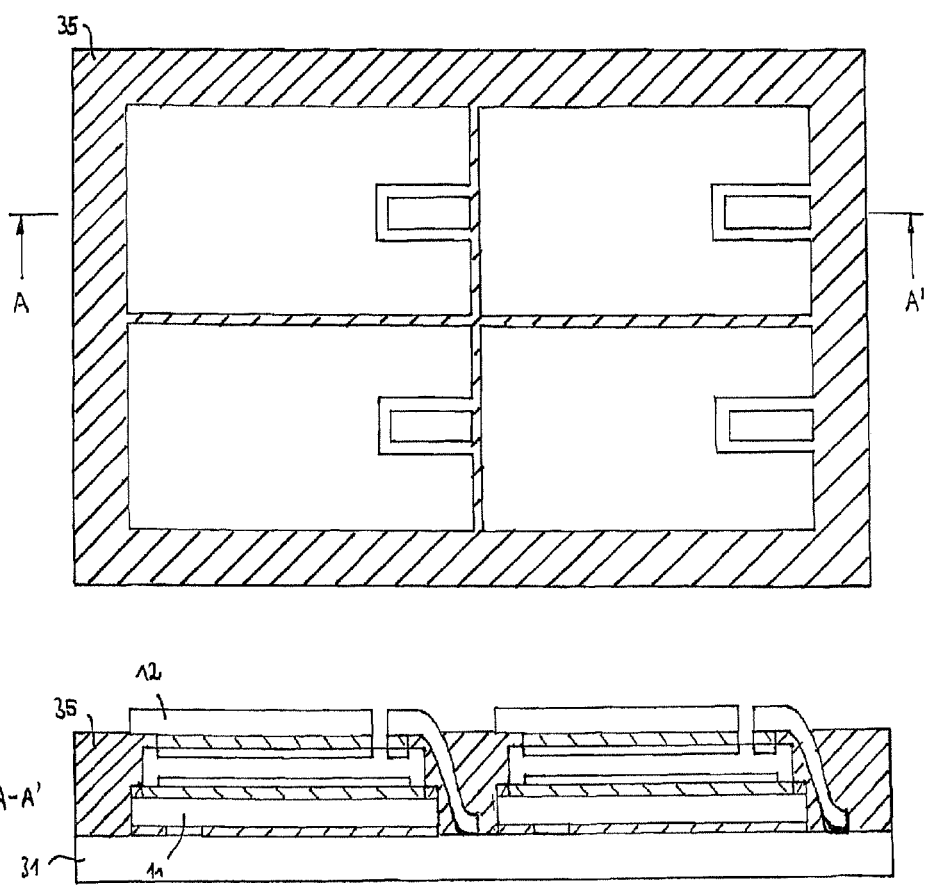
Figure 10L:
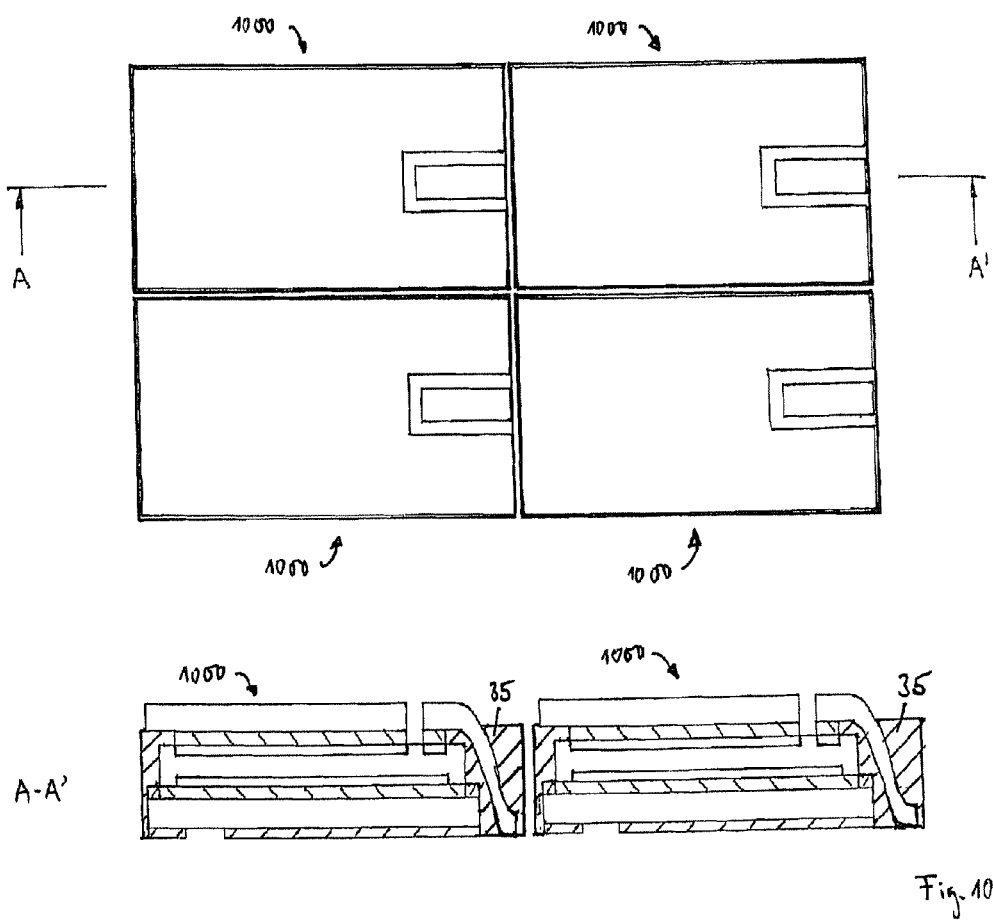

FIGS. 10A to 10L schematically illustrate one embodiment of a method of manufacturing a device 1000, which is illustrated in FIG. 10L. The method illustrated in FIGS. 10A to 10L is almost identical to the method illustrated in FIGS. 3A to 3K. The differences between both methods are described in the following.

As illustrated in FIG. 10A, the first metal foil 11 is provided. The first metal foil 11 is illustrated in a top plan view (top) and a cross-sectional view (bottom) along the line A-A' depicted in the top plan view. In contrast to the first metal foil 11 illustrated in FIG. 3A, the first metal foil 11 of FIG. 10A is not structured so that the first and second faces 20 and 21 of the first metal foil 11 are uniform and unbroken.

The electrically insulating material 23 may be deposited on the second face 21 of the first metal foil 11 as illustrated in FIG. 10B. The electrically insulating material 23 may be structured. A plurality of recesses 24, 70 and 71 are created in the electrically insulating material 23, which expose portions of the second face 21 of the first metal foil 11. The recesses 70 are located at places where the structured first metal foil 11 of FIG. 3A has recesses 22, and along the recesses 71 the devices 1000 are separated later on.

The fabrication processes illustrated in FIGS. 10C to 10G correspond to the fabrication processes illustrated in FIGS. 3C to 3G, wherein the second metal foil 12 of FIG. 10G is not structured, but is uniform and unbroken.

After the production of the soldered joints (or glued or sintered joints) between the first and second metal foils 11, 12 and the semiconductor chips 10, a material 71 may be deposited on top of the second metal foil 12 as illustrated in FIG. 10H. For the deposition of the material 71 the same deposition methods may be used as described above in connection with the deposition of the electrically insulating material 23. The material 71 may be printed on the second metal foil 12. Furthermore, the same materials may be used for the material 71 as described above in connection with the electrically insulating material 23.

The material 71 may be structured. A plurality of recesses 72 and 73 are created in the material 71, which expose portions of the second metal foil 12. The recesses 72 are located at places where the structured second metal foil 12 of FIG. 3G has recesses 30, and along the recesses 73 the devices 1000 are separated later on. Furthermore, the recesses 74 exposing the first metal layer 11 are protected by an appropriate material 74, for example wax, which is resistant to the etching agent which is used in the next fabrication step.

Subsequently, the bottom face of the first metal foil 11 and the top face of the second metal foil 12 are exposed to a suitable fluid etching agent, which etches the exposed portions of the first and second metal foils 11, 12. Afterwards, the material 74 may be removed, but may also be removed during a later fabrication step. Furthermore, the material 71 may be removed from the second metal foil 12 if the material 71 is only used as an etching mask. The material 71 may also be left on the second metal foil 12 if the material 71 is electrically insulating and has an appropriate thermal conductivity. The result of the etching process is illustrated in FIG. 10I.

The fabrication processes illustrated in FIGS. 10J to 10L correspond to the fabrication processes illustrated in FIGS. 3I to 3K.

Figure 11D:
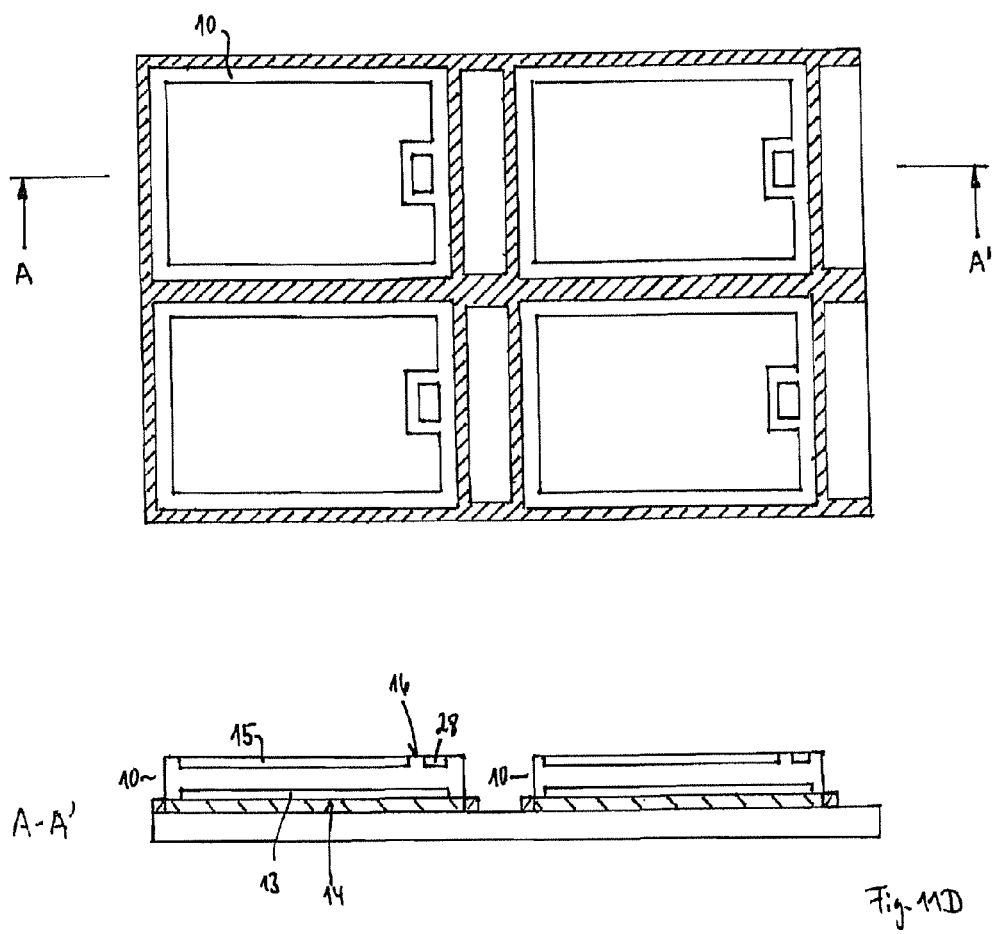
Figure 11E:
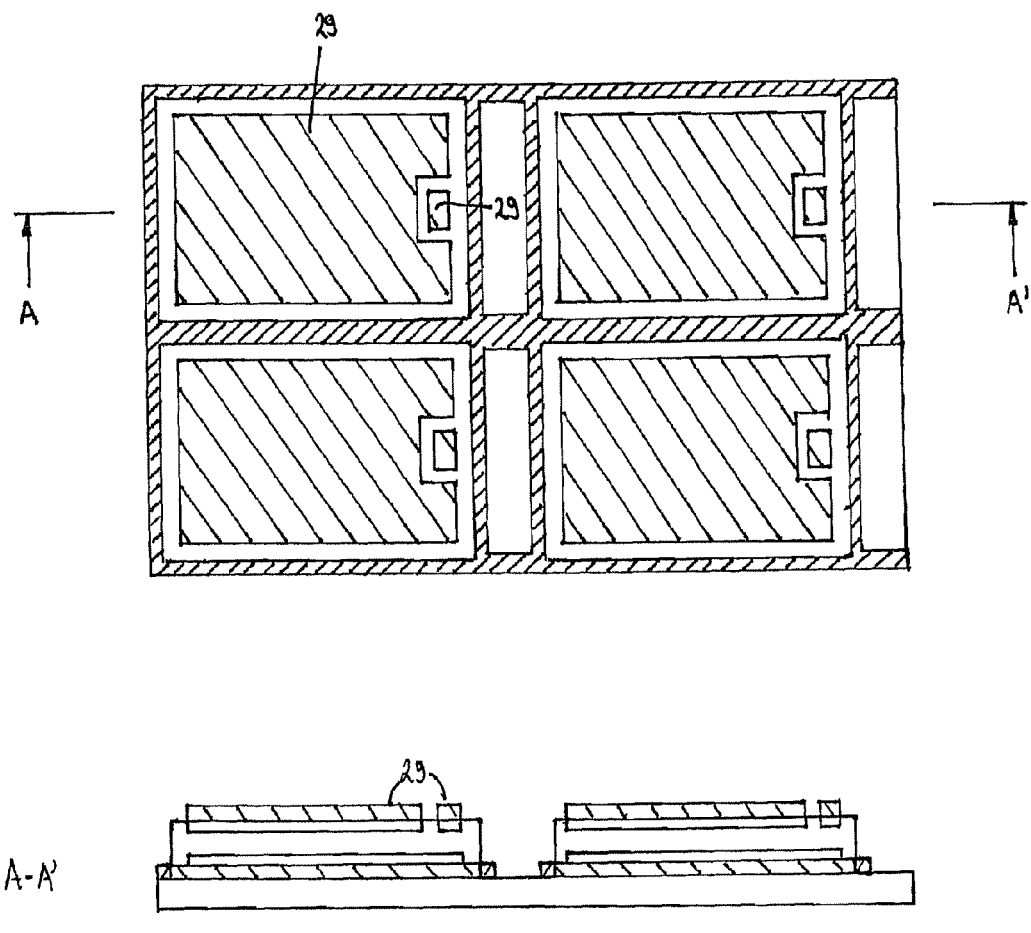
Figure 11G:
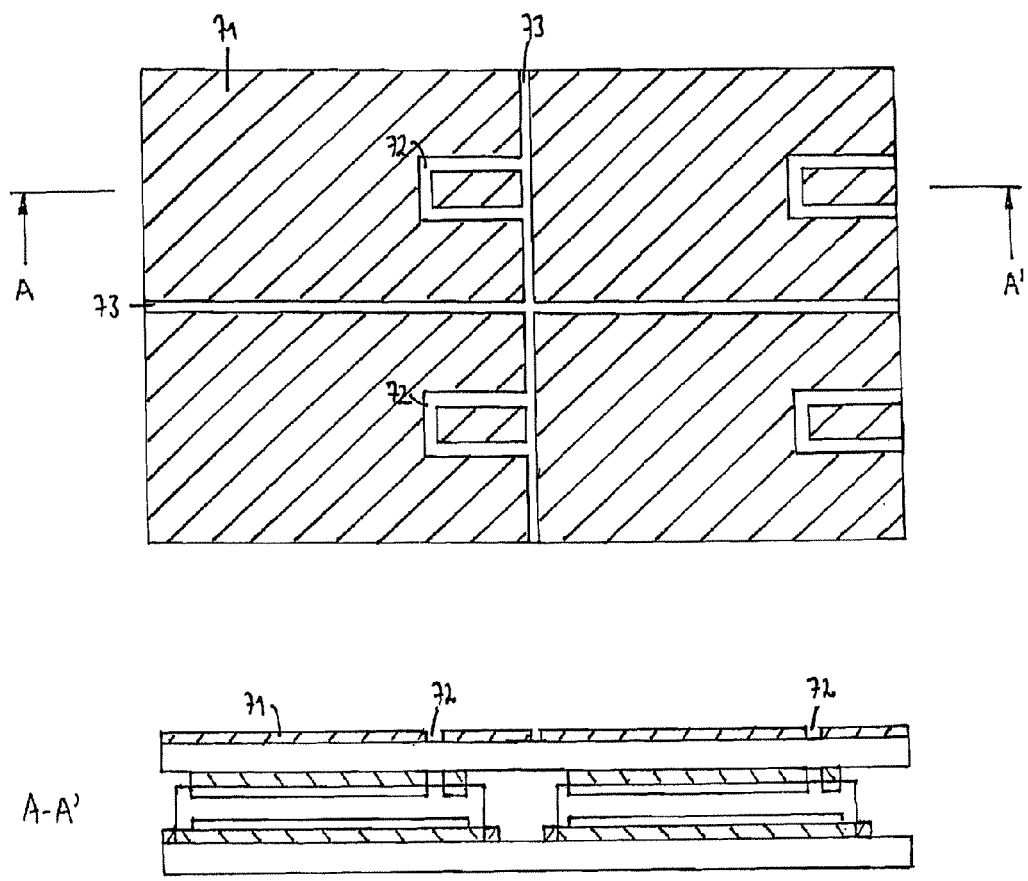

FIGS. 11A to 11M schematically illustrate one embodiment of a method of manufacturing a device 1100, which is illustrated in FIG. 11M. The method illustrated in FIGS. 11A to 11M is almost identical to the method illustrated in FIGS. 10A to 10L. The differences between both methods are described in the following.

The fabrication processes illustrated in FIGS. 11A to 11G correspond to the fabrication processes illustrated in FIGS. 10A to 10H, however the deposition of the electrically insulating material 23 on the second face 21 of the first metal foil 11 as illustrated in FIG. 10B is omitted. The deposition of the electrically insulating material 23 is carried out in the fabrication process illustrated in FIG. 11H, which means that the electrically insulating material 23 is deposited after soldering, gluing or sintering the first and second metal foils 21, 22 and the semiconductor chips 10 together. The structuring of the electrically insulating material 23 is the same as illustrated in FIG. 10B.

Figure 11I:
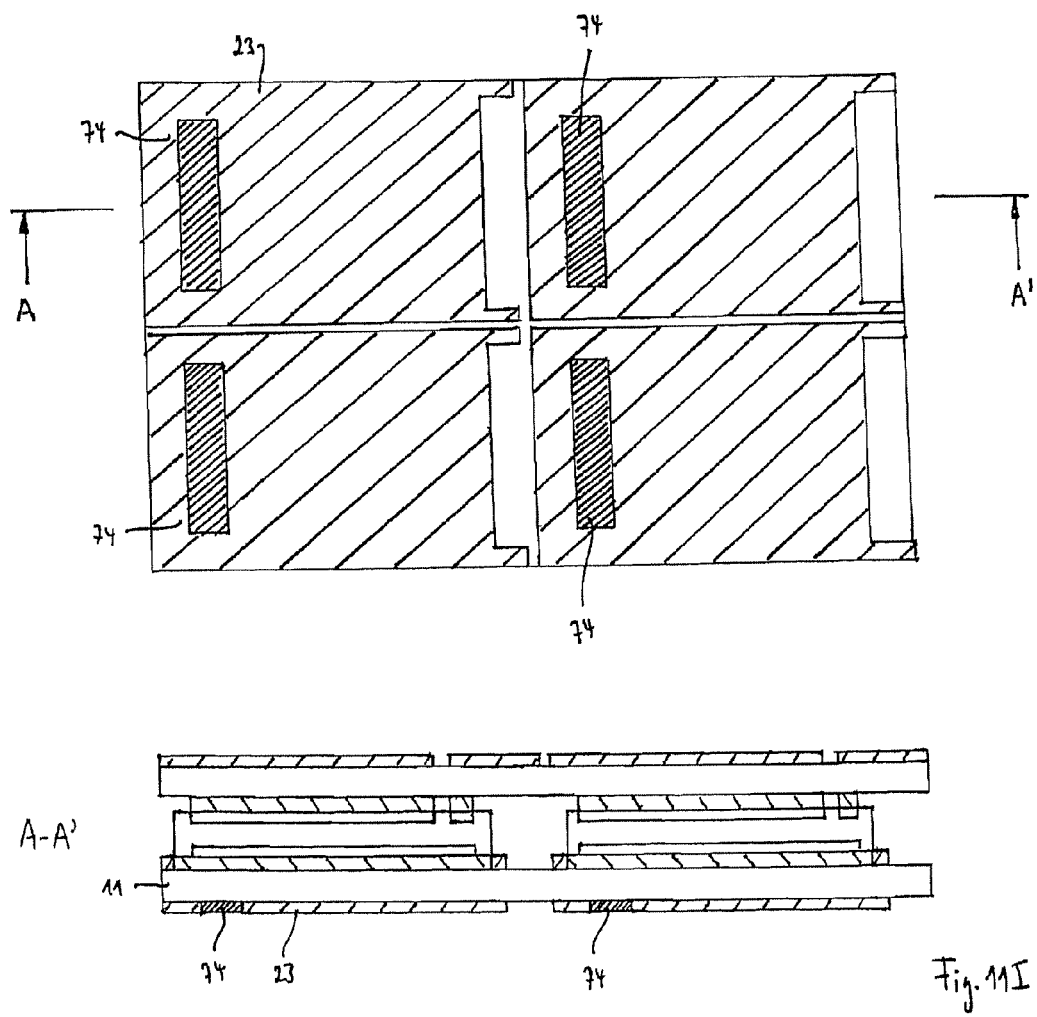

As illustrated in FIG. 11I, the recesses 24 in the electrically insulating material 23 exposing the first metal layer 11 are protected by the material 74, for example wax, which is resistant to the etching agent.

As illustrated in FIG. 11J, only the bottom face of the first metal layer 11 is exposed to the etching agent, which etches the exposed portions of the first metal foil 11 in order to obtain the recesses 22 in the first metal foil 11.

Similar to the fabrication process illustrated in FIG. 3J, the electrically insulating material 35 may be applied to the side faces of the first metal foil 11 and the semiconductor chips 10 as illustrated in FIG. 11K. The electrically insulating material 35 may, however, not cover the bottom face of the first metal foil 11 and the top face of the second metal foil 12. At locations where the second metal foil 12 is bent later on, holes 80 may be arranged in the electrically insulating material 35. According to one embodiment, which is illustrated at the bottom of FIG. 11K, the electrically insulating material 35 only covers one the devices when applied between two neighboring devices. In the illustration of FIG. 11K, the left one of the two devices is covered with the electrically insulating material 35, the second metal foil 12 of which is bent later on.

Figure 11L:
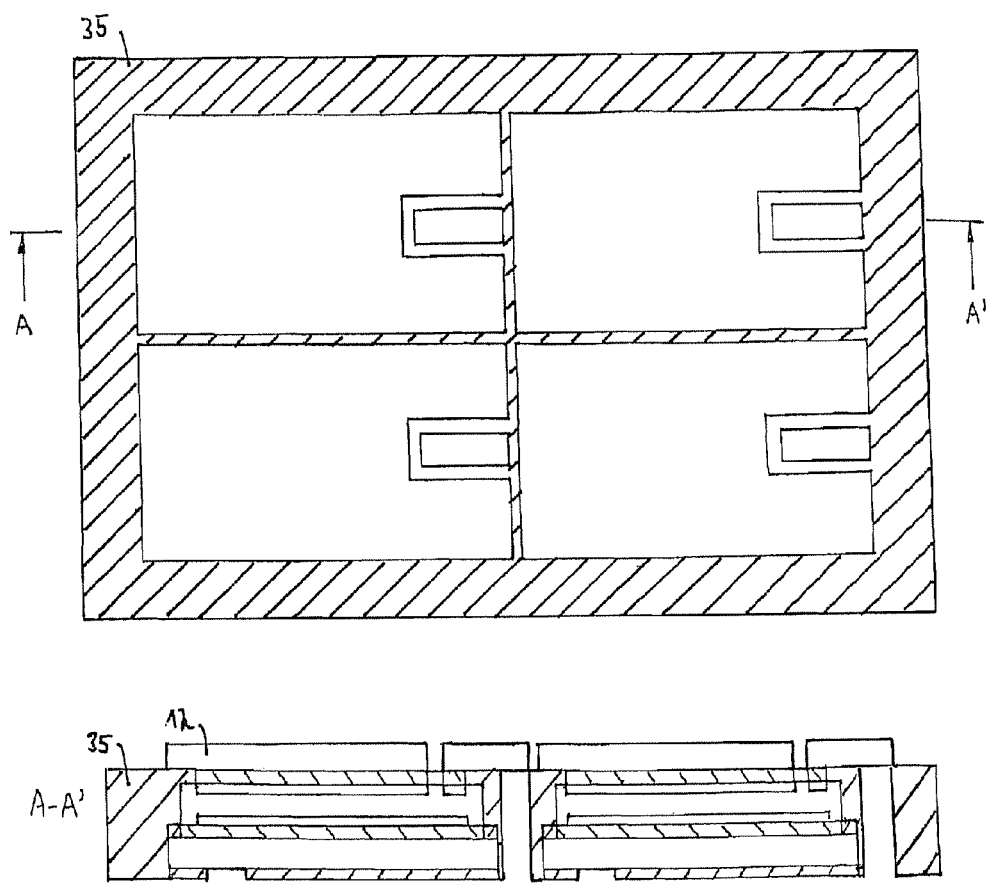

As illustrated in FIG. 11L, only the top face of the second metal layer 12 is then exposed to the etching agent, which etches the exposed portions of the second metal foil 12. The material 71 may be removed from the second metal foil 12 if the material 71 is only used as an etching mask. The material 71 may also be left on the second metal foil 12 if the material 71 is electrically insulating and has an appropriate thermal conductivity. The material 74 may be removed if it is electrically insulating. If the material 74 is electrically conductive, it may be left on the devices 1100.

The electrically insulating material 35 may be soft enough that it allows bending of the second metal foil 12 such that surfaces 34 of the second metal foil 12 lie in a plane parallel to the plane defined by the second face 21 of the first metal foil 11 as illustrated in FIG. 11M. This fabrication process is similar to the fabrication process illustrated in FIG. 3I. Moreover, the electrically insulating material 35 may be divided thereby separating the devices 1100 from one another, for example by sawing, cutting, milling or laser ablation.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
providing a first metal foil and a second metal foil;
providing a plurality of semiconductor chips each comprising a first electrode on a first face and a second electrode on a second face opposite to the first face;
applying an electrically insulating material on a first face of the first metal foil;
structuring the electrically insulating material such that at least portions of the first face of the first metal foil are exposed; and
attaching the exposed first face of the first metal foil to the first electrodes of the semiconductor chips and the second metal foil to the second electrodes of the semiconductor chips.

2. The method of claim 1, comprising separating the semiconductor chips from each other by dividing at least one of the first metal foil and the second metal foil.

3. The method of claim 1, comprising attaching at least one of the first metal foil and the second metal foil by at least one of soldering, gluing and sintering.

4. The method of claim 1, comprising placing solder material between the first metal foil and the semiconductor chips and between the semiconductor chips and the second metal foil and melting the solder material after arranging the first metal foil, the semiconductor chips and the second metal foil on top of each other.

5. The method of claim 1, comprising:
placing electrically conductive adhesive between the first metal foil and the semiconductor chips and between the semiconductor chips and the second metal foil; and
hardening the electrically conductive adhesive after arranging the first metal foil, the semiconductor chips and the second metal foil on top of each other.

6. The method of claim 1, comprising placing metal particles between the first metal foil and the semiconductor chips and between the semiconductor chips and the second metal foil and sintering the metal particles after arranging the first metal foil, the semiconductor chips and the second metal foil on top of each other.

7. The method of claim 1, comprising bending a first portion of the second metal foil towards, the first metal foil, or bending a first portion of the first metal foil towards the second metal foil.

8. The method of claim 7, comprising bending the first portion of the second metal foil after dividing the second metal foil.

9. The method of claim 7, comprising attaching the first portion of the second metal foil to the second electrode of the semiconductor chips and a second portion of the second metal foil to a third electrode of the semiconductor chips, bent towards the first metal foil.

10. The method of claim 1, wherein providing the first metal foil and the second metal foil comprises providing at least one of the first metal foil and the second metal foil having a thickness between 50 μm and 150 μm.

11. A method, comprising:
providing a first metal foil and a second metal foil;
providing a plurality of semiconductor chips each comprising a first electrode on a first face and a second electrode on a second face opposite to the first face;
attaching the first metal foil to the first electrodes of the semiconductor chips and the second metal foil to the second electrodes of the semiconductor chips; and
structuring, via etching, at least one of the first metal foil and the second metal foil after attaching the first metal foil to the first electrodes of the semiconductor chips and the second metal foil to the second electrodes of the semiconductor chips.

12. The method of claim 11, further comprising:
applying an electrically insulating material on a first face of the first metal foil; and
structuring the electrically insulating material such that at least portions of the first face of the first metal foil are exposed.

13. The method of claim 11, further comprising:
attaching the first metal foil, the semiconductor chips, and the second metal foil to a carrier; and
separating the semiconductor chips from each other by dividing at least one of the first metal foil and the second metal foil after attaching the first metal foil, the semiconductor chips, and the second metal foil to the carrier.

14. The method of claim 13, further comprising:
removing the carrier after separating the semiconductor chips from each other.

15. The method of claim 13, further comprising:
applying an electrically insulating material to the carrier such that at least portions of the first metal foil, the semiconductor chips, and the second metal foil contact the electrically insulating material.

16. The method of claim 11, wherein providing the first metal foil and the second metal foil comprises providing at least one of the first metal foil and the second metal foil having a thickness between 50 μm and 150 μm.

17. A method, comprising:
providing a first metal foil and a second metal foil;
providing a plurality of semiconductor chips each comprising a first electrode on a first face and a second electrode on a second face opposite to the first face;
attaching the first metal foil to the first electrodes of the semiconductor chips and the second metal foil to the second electrodes of the semiconductor chips;
attaching the first metal foil, the semiconductor chips, and the second metal foil to a carrier;
applying an electrically insulating material to the carrier such that at least portions of the first metal foil, the semiconductor chips, and the second metal foil contact the electrically insulating material; and
separating the semiconductor chips from each other by dividing at least one of the first metal foil and the second metal foil after attaching the first metal foil, the semiconductor chips, and the second metal foil to the carrier.

18. The method of claim 17, further comprising:
removing the carrier after separating the semiconductor chips from each other.

19. The method of claim 17, further comprising:
applying a first electrically insulating material on a first face of the first metal foil; and
structuring the first electrically insulating material such that at least portions of the first face of the first metal foil are exposed.

20. The method of claim 19, further comprising:
applying a second electrically insulating material on a second face of the first metal foil, the second face of the first metal foil opposite the first face of the first metal foil; and
structuring the second electrically insulating material such that at least portions of the second face of the first metal foil are exposed.

21. The method of claim 17, wherein providing the first metal foil and the second metal foil comprises providing at least one of the first metal foil and the second metal foil having a thickness between 50 μm and 150 μm.

22. The method of claim 17, wherein providing the plurality of semiconductor chips comprises providing the plurality of semiconductor chips each comprising a third electrode on the second face, and
wherein attaching the second metal foil comprises attaching the second metal foil to the third electrode.

23. The method of claim 17, further comprising:
bending a first portion of the second metal foil towards the carrier such that the first portion contacts the carrier.

* * * * *